(12) United States Patent
Miyake et al.

(10) Patent No.: US 8,022,427 B2
(45) Date of Patent: Sep. 20, 2011

(54) NITRIDE-BASED SEMICONDUCTOR DEVICE AND METHOD OF MANUFACTURING THE SAME

(75) Inventors: Yasuto Miyake, Hirakata (JP); Ryoji Hiroyama, Kyo-tanabe (JP); Masayuki Hata, Kadoma (JP); Yasumitsu Kuno, Hirakata (JP)

(73) Assignee: Sanyoelectric Co., Ltd., Osaka (JP)

( * ) Notice: Subject to any disclaimer, the term of this patent is extended or adjusted under 35 U.S.C. 154(b) by 0 days.

(21) Appl. No.: 12/429,854

(22) Filed: Apr. 24, 2009

(65) Prior Publication Data

US 2009/0267100 A1  Oct. 29, 2009

(30) Foreign Application Priority Data

Apr. 25, 2008 (JP) ................................. 2008-115373
Mar. 26, 2009 (JP) ................................. 2009-076259

(51) Int. Cl.
*H01L 33/00* (2010.01)
(52) U.S. Cl. ... 257/98; 257/615; 257/618; 257/E33.068; 257/E29.022
(58) Field of Classification Search ................... 257/98, 257/615, 618, E33.068, E29.022
See application file for complete search history.

(56) References Cited

U.S. PATENT DOCUMENTS

| | | | |
|---|---|---|---|
| 6,100,106 A | 8/2000 | Yamaguchi et al. | |
| 2007/0200177 A1 | 8/2007 | Hata et al. | |
| 2007/0221932 A1 | 9/2007 | Kano et al. | |
| 2007/0292979 A1* | 12/2007 | Hata et al. | ........ 438/22 |
| 2008/0251796 A1* | 10/2008 | Lee et al. | ........ 257/88 |
| 2008/0283846 A1 | 11/2008 | Ohmae et al. | |

FOREIGN PATENT DOCUMENTS

| | | |
|---|---|---|
| JP | 2780618 B2 | 5/1998 |
| JP | 11150335 A | 6/1999 |
| JP | 11224866 A | 8/1999 |
| JP | 2006303471 A | 11/2006 |
| JP | 2007266574 A | 10/2007 |
| JP | 2008288461 A | 11/2008 |
| JP | 2008542183 A | 11/2008 |
| WO | 2006130623 A2 | 7/2006 |

* cited by examiner

*Primary Examiner* — Tan N Tran
(74) *Attorney, Agent, or Firm* — Ditthavong Mori & Steiner, P.C.

(57) ABSTRACT

A nitride-based semiconductor device includes a substrate, a first step portion formed on a main surface side of a first side end surface of the substrate, a second step portion formed on the main surface side of a second side end surface substantially parallel to the first side end surface on an opposite side of the first side end surface and a nitride-based semiconductor layer whose first side surface is a (000-1) plane starting from a first side wall of the first step portion and a second side surface starting from a second side wall of the second step portion on the main surface.

20 Claims, 14 Drawing Sheets

NITRIDE-BASED SEMICONDUCTOR DEVICE AND METHOD OF MANUFACTURING THE SAME

CROSS-REFERENCE TO RELATED APPLICATIONS

The priority application numbers JP2008-115373, Nitride-Based Semiconductor Light-Emitting Device and Method of Manufacturing the Same, Apr. 25, 2008, Yasuto Miyake et al, JP2009-76259, Nitride-Based Semiconductor Light-Emitting Device and Method of Manufacturing the Same, Mar. 26, 2009, Yasuto Miyake et al, upon which this patent application is based are hereby incorporated by reference.

BACKGROUND OF THE INVENTION

1. Field of the Invention

The present invention relates to a nitride-based semiconductor device and a method of manufacturing the same.

2. Description of the Background Art

In general, a light-emitting device made of a nitride-based material such as gallium nitride (GaN) has been put into practice as a 405 nm blue-violet semiconductor laser (LD) as a light source for recording/playback employed as a DVD system. A semiconductor laser device emitting blue or green light, employing a nitride-based material has been developed. Such a nitride-based semiconductor laser device is disclosed in each of Japanese Patent No. 2780618 and Japanese Patent Laying-Open No. 11-224866, for example.

A manufacturing process for nitride-based semiconductor chip described in the aforementioned Japanese Patent No. 2780618 comprises steps of forming a pair of dividing grooves opposed to each other on an upper surface of a semiconductor layer and a lower surface of a sapphire substrate in a wafer in which a semiconductor material is stacked on the sapphire substrate, and a step of separating the wafer into chips by dividing the semiconductor layer and the sapphire substrate at portions of these pair of dividing grooves. The pair of dividing grooves are formed by etching or mechanical scribing such as diamond scribing.

A method of manufacturing a laser chip described in the aforementioned Japanese Patent Laying-Open No. 11-224866 comprises a step of dividing a sapphire substrate while forming dividing grooves on a function film and the sapphire substrate by applying a $CO_2$ laser to a wafer where the function film (semiconductor layer) is stacked on the sapphire substrate from a side of an upper surface of the sapphire substrate once or a plurality of times. The sapphire substrate is separated into chips by dividing portions formed with no dividing grooves utilizing thermal stress in laser application in addition to formation of the dividing grooves by the $CO_2$ laser.

In a manufacturing process for the semiconductor chip disclosed in each of the aforementioned Japanese Patent No. 2780618 and Japanese Patent Laying-Open No. 11-224866, however, defects are likely to be caused on the semiconductor layer when forming the dividing grooves because they are formed by etching, mechanically scribing or laser scribing the semiconductor layer which is formed on the substrate by crystal growth. In a case where the nitride-based semiconductor device is the light-emitting device, when the defects reach an emission layer constituting the semiconductor layer, luminous efficiency of the light-emitting device is disadvantageously reduced, and heat is excessively generated in the device following the reduction of the luminous efficiency. In a case where the nitride-based semiconductor device is an electronic device such as a field-effect transistor (FET), abnormal heat is disadvantageously generated due to the defects of the semiconductor layer. Thus, the nitride-based semiconductor device such as the light-emitting device or the electronic device is disadvantageously deteriorated and the life is disadvantageously reduced.

SUMMARY OF THE INVENTION

A nitride-based semiconductor device according to a first aspect of the present invention comprises a substrate, a first step portion formed on a main surface side of a first side end surface of the substrate, a second step portion formed on the main surface side of a second side end surface substantially parallel to the first side end surface on an opposite side of the first side end surface, and a nitride-based semiconductor layer whose first side surface is a (000-1) plane starting from a first side wall of the first step portion and a second side surface starting from a second side wall of the second step portion on the main surface.

As hereinabove described, this nitride-based semiconductor device according to the first aspect of the present invention comprises the nitride-based semiconductor layer having the first side surface formed starting from the first side wall of the first step portion and the second side surface formed starting from the second side wall of the second step portion on the main surface. Thus, dissimilarly to a semiconductor device obtained by forming dividing grooves on the nitride-based semiconductor layer by etching, mechanically scribing or laser scribing and separated into chips, the first and second side surfaces are not side surfaces formed by the dividing grooves which are formed through the aforementioned method. Therefore, no defect and the like caused on the semiconductor layer in forming the dividing grooves through the aforementioned method exists on the first and second side surfaces. Thus, heat is unlikely to be abnormally generated in the semiconductor device, and hence reduction in the life of the semiconductor device can be suppressed.

In the aforementioned nitride-based semiconductor device according to the first aspect, the nitride-based semiconductor layer preferably has an emission layer, and the nitride-based semiconductor device is preferably a light-emitting device. According to this structure, defects and the like do not exist on the semiconductor layer having the first side surface and the second side surface, and hence the semiconductor light-emitting device in which reduction in luminous efficiency of the device is suppressed can be easily formed.

In the aforementioned nitride-based semiconductor device according to the first aspect, the nitride-based semiconductor device is preferably an electronic device. According to this structure, defects and the like do not exist on the semiconductor layer having the first side surface and the second side surface, and heat abnormally generated from the semiconductor device can be suppressed, and hence the electronic device in which reduction in the life of the semiconductor device is suppressed can be easily formed.

In the aforementioned nitride-based semiconductor device according to the first aspect, the first side wall is preferably formed by a (000-1) plane. According to this structure, the (000-1) plane of the nitride-based semiconductor layer is so formed as to take over the first side wall having the (000-1) plane when the nitride-based semiconductor layer having the first side surface having the (000-1) plane is formed on the main surface of the substrate, and hence the first side surface having the (000-1) plane can be easily formed on the substrate.

In the aforementioned nitride-based semiconductor device according to the first aspect, the second side surface is preferably formed by a {A+B, A, −2A−B, 2A+B} plane (A and B satisfy A≧0 and B≧0, and at least either one of A and B is a nonzero integer). According to this structure, the nitride-based semiconductor layer is grown on the main surface of the substrate having the first step portion and the second step portion, whereby the second side surface having the {A+B, A, −2A−B, 2A+B} plane can be easily formed in addition to the first side surface having the (000-1) plane.

In the aforementioned structure in which the second side surface is formed by the (A+B, A, −2A−B, 2A+B) plane, the second side surface is preferably formed by a (1-101) plane or a (11-22) plane. According to this structure, faces of these side surfaces are nitrogen faces (N-faces) and have excellent flatness. This reason is conceivable as follows:

While the plane having slow growth rate such as the (000-1) plane or the {A+B, A, −2A−B, 2A+B} plane conceivably has small surface energy, the plane having fast growth rate such as the (1-100) plane conceivably has large surface energy. The surface during crystal growth is stable when the energy is smaller, and hence the plane other than the (1-100) plane is likely to appear. Consequently, flatness of the plane is likely to be deteriorated. According to the present invention, on the other hand, when the (1-100) plane is grown while forming the (000-1) plane or the {A+B, A, −2A−B, 2A+B} plane having surface energy smaller than the (1-100) plane grown as the main surface, surface energy can be reduced as compared with a case of crystal growing only the (1-100) plane as a growth plane, and hence flatness of the growth plane is conceivably improved.

In the aforementioned nitride-based semiconductor device according to the first aspect, the nitride-based semiconductor layer is preferably so formed that a plane area of the nitride-based semiconductor layer is reduced in a direction away from the substrate along a direction of stacking of the nitride-based semiconductor layer by the first side surface and the second side surface. According to this structure, a larger space (region where the first side surface and the second side surface are opposed to each other in a wafer state (upper region of the step portion)) than a plane area of the first step portion and the second step portion of the substrate is formed on the surface of the semiconductor layer on a side opposite to the substrate by the first side surface and the second side surface, and hence the wafer can be easily divided between the first side surface and the second side surface when separating the semiconductor device into chips.

In the aforementioned nitride-based semiconductor device according to the first aspect, at least either the first side surface or the second side surface is preferably formed at slant so as to form an obtuse angle with respect to the main surface. According to this structure, the region where the first side surface and the second side surface of the nitride-based semiconductor are opposed to each other (upper region of the recess portion of the substrate) are formed to expand from the substrate toward the surface of the nitride-based semiconductor layer. Therefore, when the present invention is applied to a light-emitting diode, light emitted from the emission layer can be easily extracted to the surface side (upper surface) of the nitride-based semiconductor layer not only through the surface of the nitride-based semiconductor layer but also through the first side surface or the second side surface inclined with respect to the main surface of the substrate, and hence luminous efficiency of the nitride-based semiconductor device can be improved.

In the aforementioned nitride-based semiconductor device according to the first aspect, the first side surface and the second side surface are preferably formed by crystal growth facets of the nitride-based semiconductor layer. According to this structure, two types of growth facets of the aforementioned first and second side surfaces can be formed simultaneously with the crystal growth of the nitride-based semiconductor layer. A fine corrugated shape caused by etching, mechanical scribing or laser scribing is not formed on the first and second side surfaces formed by the crystal growth facets. Thus, defects and the like are not caused on the semiconductor layer (emission layer) resulting from the fine corrugated shape, and hence reduction in the luminous efficiency and the life of the nitride-based semiconductor device can be further suppressed similarly to the aforementioned effects.

In the aforementioned nitride-based semiconductor device according to the first aspect, the substrate is preferably made of a nitride-based semiconductor. According to this structure, the first side surface and the second side surface can be easily formed when the nitride-based semiconductor layer is grown on the substrate made of a nitride-based semiconductor.

In the aforementioned nitride-based semiconductor device according to the first aspect, the substrate preferably includes a base substrate and an underlayer made of AlGaN formed on the base substrate, when lattice constants of the base substrate and the underlayer are $c_1$ and $c_2$ respectively, $c_1$ and $c_2$ preferably satisfy relation of $c_1 > c_2$, and the first side surface and the second side surface are preferably formed starting from an inner side surface of a crack formed to extend substantially parallel to a (0001) plane of the underlayer and the main surface respectively. According to this structure, the lattice constant of the underlayer is smaller than the lattice constant of the base substrate, and hence tensile stress can be caused inside the underlayer when the underlayer made of AlGaN is formed on the base substrate. The crack as the recess portion can be easily formed on the surface of the underlayer by this tensile stress, and hence the first side surface and the second side surface can be formed starting from this crack.

In the aforementioned nitride-based semiconductor device according to the first aspect, the first side surface and the second side surface extend along a first direction, and the nitride-based semiconductor device has an optical waveguide extending along the first direction. According to this structure, the first side surface and the second side surface extending along the first direction in which the optical waveguide extends can be utilized as side surfaces of the individual nitride-based semiconductor device after device division.

In the aforementioned structure in which the nitride-based semiconductor device has the optical waveguide, the nitride-based semiconductor layer preferably comprises a light-emitting layer. According to this structure, the first and second side surfaces extending along the first direction which is the extensional direction of the optical waveguide can be utilized as side surfaces of individually divided semiconductor laser devices or super luminescent diodes.

In the aforementioned structure in which the nitride-based semiconductor device has an optical waveguide, the nitride-based semiconductor layer is preferably formed with a first semiconductor layer, an emission layer and a second semiconductor layer from a side of the substrate, and the second semiconductor layer is formed with a ridge portion extending along the first direction. According to this structure, the optical waveguide for emitting a laser beam, emitted from the emission layer on a lower portion of the second semiconductor layer, outward can be easily formed by the ridge portion formed on the second semiconductor layer.

In the aforementioned structure in which the nitride-based semiconductor device has an optical waveguide, the first step portion and the second step portion preferably extend along a first direction. According to this structure, the optical waveguide and the first and second step portions can be formed to intersect with each other.

A nitride-based semiconductor device according to a second aspect of the present invention comprises a substrate, and a nitride-based semiconductor layer having an emission layer and including a first side surface having a (000-1) plane on a first side end surface on a side of a main surface of the substrate and a second side surface having a {A+B, A, −2A−B, 2A+B} plane (A and B satisfy A≧0 and B≧0, and at least either one of A and B is a nonzero integer) on a second side end surface substantially parallel to the first side end surface on the side of the main surface on the main surface of the substrate.

As hereinabove described, this nitride-based semiconductor device according to the second aspect comprises the nitride-based semiconductor layer including the first side surface having the (000-1) plane on the first side end surface on the side of the main surface of the substrate and a second side surface having the {A+B, A, −2A−B, 2A+B} plane on the second side end surface. Thus, dissimilarly to a semiconductor device obtained by forming dividing grooves on the nitride-based semiconductor layer by etching, mechanical scribing or laser scribing and separated into chips, the first and second side surfaces are not side surfaces formed by the dividing grooves which are formed through the aforementioned method. Therefore, no defect caused on the semiconductor layer (emission layer) in forming the dividing grooves through the aforementioned method exists on the first and second side surfaces, and hence reduction in luminous efficiency of the semiconductor device can be suppressed. Thus, heat is unlikely to be abnormally generated in the semiconductor device, and hence reduction in the life of the semiconductor device can be suppressed. Further, the nitride-based semiconductor device comprises the nitride-based semiconductor layer including the second side surface having the {A+B, A, −2A−B, 2A+B} plane on the second side end surface, whereby the second side surface having the {A+B, A, −2A−B, 2A+B} plane can be easily formed in addition to the first side surface having the (000-1) plane by growing the nitride-based semiconductor layer on the main surface of the substrate.

A method of manufacturing a nitride-based semiconductor device according to a third aspect of the present invention comprises steps of forming a plurality of recess portions on a main surface of a substrate, growing a plurality of nitride-based semiconductor layers comprising first side surfaces of a (000-1) plane formed while growing starting from first side walls of the recess portions and second side surfaces formed while corresponding to the first side surfaces and growing starting from second side walls of the recess portions on the main surface of the substrate, and separating into chips by dividing the substrate formed with the nitride-based semiconductor layers into individual semiconductor devices on regions where the first side surfaces and the second side surfaces are opposed to each other.

As hereinabove described, this method of manufacturing a nitride-based semiconductor device according to the third aspect comprises the steps of growing the plurality of nitride-based semiconductor layers comprising the first side surfaces formed while growing starting from the first side walls of the plurality of recess portions formed on the main surface of the substrate and the second side surfaces formed while growing starting from the second side walls of the recess portions, and separating into chips by dividing the substrate formed with the nitride-based semiconductor layers into individual semiconductor devices on regions where the first side surfaces and the second side surfaces are opposed to each other. Thus, dissimilarly to a semiconductor device obtained by forming dividing grooves on the nitride-based semiconductor layers by etching, mechanical scribing or laser scribing and separated into chips, the first and second side surfaces are not side surfaces formed by the dividing grooves which are formed through the aforementioned method. In other words, no defect caused on the semiconductor layers in forming the dividing grooves through the aforementioned method exists, and hence the nitride-based semiconductor device in which reduction in luminous efficiency (when the semiconductor device is a light-emitting device) or life of the semiconductor device is suppressed can be formed.

In the aforementioned method of manufacturing a nitride-based semiconductor device according to the third aspect, the step of separating into chips preferably comprises a step of separating into chips so as to divide the substrate formed with the nitride-based semiconductor layers on bottom portions of the recess portions of the regions where the first side surfaces and the second side surfaces are opposed to each other. According to this structure, a thickness of the substrate on the bottom portions of the recess portions is smaller than that of the substrate other than the bottom portions of the recess portions, and hence the wafer can be easily divided on the portions, having smaller thickness, of the substrate.

In the aforementioned method of manufacturing a nitride-based semiconductor device according to the third aspect, the nitride-based semiconductor layers preferably have emission layers, and the nitride-based semiconductor device is preferably a light-emitting device. According to this structure, defects and the like do not exist on the semiconductor layers having the first side surfaces and the second side surfaces, and hence the semiconductor light-emitting device in which reduction in luminous efficiency of the device is suppressed can be easily formed.

In the aforementioned method of manufacturing a nitride-based semiconductor device according to the third aspect, the first side walls preferably include a (000-1) plane. According to this structure, the (000-1) plane of the nitride-based semiconductor layers is so formed as to take over the first side walls having the (000-1) plane when the nitride-based semiconductor layer whose first side surfaces are the (000-1) plane is formed on the main surface of the substrate, and hence the first side surfaces having the (000-1) plane can be easily formed on the substrate.

In the aforementioned method of manufacturing a nitride-based semiconductor device according to the third aspect, the second side surfaces are preferably formed by a {A+B, A, −2A−B, 2A+B} plane (A and B satisfy A≧0 and B≧0, and at least either one of A and B is a nonzero integer). According to this structure, the second side surfaces having the {A+B, A, −2A−B, 2A+B} plane can be easily formed in addition to the first side surfaces having the (000-1) plane by growing the nitride-based semiconductor layers on the main surface of the substrate having the recess portions.

In the aforementioned method of manufacturing a nitride-based semiconductor device according to the third aspect, the step of forming the recess portions preferably includes a step of forming a (000-1) plane extending in a striped manner on the main surface of the substrate in plan view. According to this structure, the first side surfaces having the (000-1) plane of the nitride-based semiconductor layers formed on the substrate can be formed to extend in a striped manner along the (000-1) plane of the substrate extending in a striped manner.

The aforementioned method of manufacturing a nitride-based semiconductor device according to the third aspect may be as follows:

In other words, in the aforementioned method of manufacturing a nitride-based semiconductor device according to the third aspect, the step of separating into chips preferably includes a step of separating into chips so as to divide the nitride-based semiconductor layers into the individual the semiconductor light-emitting devices on the bottom portions of the recess portions of the regions where the first side surfaces and the second side surfaces are opposed to each other. According to this structure, a thickness of substrate on the bottom portions of the recess portions are smaller than that of the substrate other than the bottom portions of the recess portions, and hence the wafer can be easily divided on the portions, having smaller thickness, of the substrate.

In the aforementioned method of manufacturing a nitride-based semiconductor device according to the third aspect, the step of growing the nitride-based semiconductor layers preferably includes a step of growing the nitride-based semiconductor layers so that the plane area of the nitride-based semiconductor layers is reduced in a direction away from the substrate along a thickness direction of the nitride-based semiconductor layers by the first side surfaces and the second side surfaces. According to this structure, larger spaces (regions where the first side surfaces and the second side surfaces are opposed to each other in a wafer state (upper regions of the step portions)) than a plane area of the recess portions of the substrate is formed on the surface of the semiconductor layer on a side opposite to the substrate by the first side surfaces and the second side surfaces, and hence the wafer can be easily divided between the first side surfaces and the second side surfaces when separating the semiconductor device into chips.

In the aforementioned method of manufacturing a nitride-based semiconductor device according to the third aspect, the nitride-based semiconductor device preferably comprises light-emitting layers having optical waveguides, and the step of growing the nitride-based semiconductor layers includes a step of growing the nitride-based semiconductor layers so that the first side surfaces and the second side surfaces extend along an extensional direction of the optical waveguides. According to this structure, the first and second side surfaces extending along the first direction in which the optical waveguides extend can be easily utilized as side surfaces of the individual semiconductor laser device after device division.

In the aforementioned method of manufacturing a nitride-based semiconductor laser device according to the third aspect, the substrate preferably includes a base substrate and an underlayer formed on the base substrate, and the step of forming the recess portions preferably includes a step of forming the recess portions on the underlayer. According to this structure, the nitride-based semiconductor layers whose first side surfaces are the (000-1) plane can be easily so formed as to take over the inner side surfaces (first side wall) of the recess portions by utilizing the recess portions formed on the underlayer when the nitride-based semiconductor layers are formed on the main surface of the base substrate.

In this case, the underlayer preferably includes an AlGaN layer, $c_1$ and $c_2$ preferably satisfy relation of $c_1 > c_2$ when lattice constants of the base substrate and the underlayer are $c_1$ and $c_2$ respectively, and the step of forming the recess portions preferably includes a step of forming the recess portions formed by first planes of cracks formed substantially parallel to a (0001) plane on the underlayer. According to this structure, when forming the underlayer made of AlGaN on the base substrate, the lattice constant $c_2$ of the underlayer is smaller than the lattice constant $c_1$ of the base substrate ($c_1 > c_2$), and hence tensile stress is caused inside the underlayer in response to the lattice constant c1 of the base substrate. Consequently, the underlayer can not withstand this tensile stress, and hence the cracks are formed on the underlayer along the (000-1) plane when the thickness of the underlayer is at least a prescribed thickness. Thus, a facet having (000-1) plane which is the basis for forming the (000-1) plane of the nitride-based semiconductor layers on the underlayer can be easily formed on the underlayer. Consequently, the nitride-based semiconductor layers whose first side surfaces are the (000-1) plane can be easily formed to take over the (000-1) facets formed by the first planes of the cracks formed on the underlayer when forming the nitride-based semiconductor layers on the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

A structure of a nitride-based semiconductor laser device 10, which is an example of a schematic structure of a nitride-based semiconductor device according to the present invention, will be described with reference to FIG. 1, before specifically illustrating the embodiments of the present invention.

Figure 1:
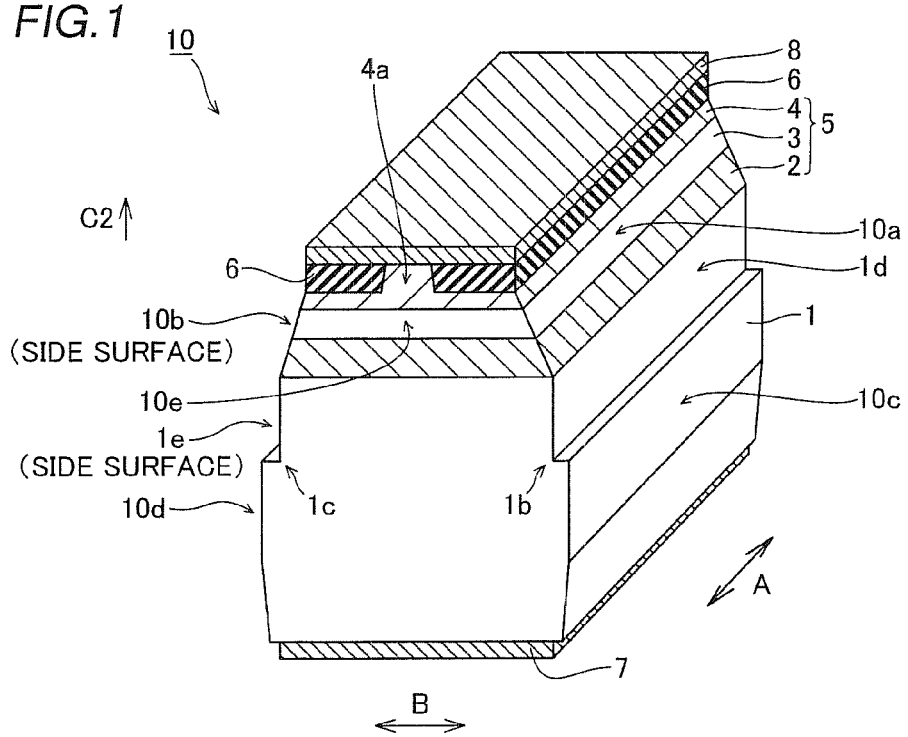
FIG. 1 is a perspective view for schematically illustrating a structure of a semiconductor device according to the present invention.

In the nitride-based semiconductor laser device 10, a nitride-based semiconductor layer 5 in which a first semiconductor layer 2, an emission layer 3 and a second semiconductor layer 4 are stacked in this order is formed on a growth substrate 1, as shown in FIG. 1. The nitride-based semiconductor layer 5 is formed with side surfaces 10a and 10b extending in a cavity direction (direction A). When the side surface 10a is formed by a (000-1) plane, the side surface 10b is preferably formed by a {A+B, A, −2A−B, 2A+B} plane (A and B satisfy A≧0 and B≧0, and at least either one of A and B is a nonzero integer).

The side surfaces 10a and 10b of the nitride-based semiconductor laser device 10 in a direction B are formed while growing starting from side walls 1d and 1e of step portions 1b and 1c formed on side end surfaces 10c and 10d of a main surface of the growth substrate 1, respectively. Therefore, the side surface 10a and the side surface 10b are formed by crystal growth facets and have high flatness. The growth substrate 1 is an example of the "substrate" in the present invention, the first semiconductor layer 2, the emission layer 3 and the second semiconductor layer 4 are examples of the "nitride-based semiconductor layer" in the present invention. The side surfaces 10a and 10b are examples of the "first side surface" and the "second side surface" in the present invention, respectively. The side end surfaces 10c and 10d are example of the "first side end surface" and the "second side end surface" in the present invention, respectively. The step portions 1b and 1c are examples of the "first step portion" and the "second step portion" in the present invention, respectively, and the side walls 1d and 1e are examples of the "first side wall" and the "second side wall" in the present invention, respectively.

The second semiconductor layer 4 of the nitride-based semiconductor layer 5 is formed with a mesa shaped projecting portion and planar portions on both sides of the projecting portion. This projecting portion is formed to extend substantially parallel to the cavity direction (direction A) in a striped manner, as viewed from sides of cavity facets 10e, thereby forming a ridge portion 4a of the nitride-based semiconductor laser device 10. An optical waveguide is formed on a portion of the emission layer 3 located on a lower portion of the ridge portion 4a. A method of forming a waveguide structure is not restricted to a method of forming a ridge portion, but the waveguide structure may be formed by a buried heterostructure. The cavity facets 10e are formed by a (−A, A+B, −B, 0) plane, and the waveguide and the ridge portion 4a extend perpendicular to a [0001] direction in a [−A, A+B, −B, 0] direction which is an in-plane direction of a main surface of the substrate (growth substrate 1). A current blocking layer 6 made of $SiO_2$ is formed to cover an upper surface of the planar portion and both side surfaces of the projecting portion of the second semiconductor layer 4. A first electrode 7 is formed on a lower surface of the growth substrate 1, and a second electrode 8 is formed to cover an upper portion of the projecting portion (ridge portion 4a) of the second semiconductor layer 4 and an upper portion of the current blocking layer 6.

In the present invention, the growth substrate 1 may be formed by a substrate or a semiconductor layer, or may be formed by both of the substrate and the semiconductor layer. When the growth substrate 1 is formed by both of the substrate and the semiconductor layer, the semiconductor layer is formed between the substrate and the first semiconductor layer 2. The growth substrate 1 may be employed as a support substrate for supporting the semiconductor layer on a growth surface (main surface) of the semiconductor layer after growing the semiconductor layer.

A GaN substrate or an α-SiC substrate can be employed as the substrate. A nitride-based semiconductor layer having a main surface whose orientation is identical with that of the substrate is formed on the GaN substrate and the α-SiC substrate. For example, nitride-based semiconductor layers whose main surfaces are a-planes and m-planes are formed on the a-plane and the m-plane of the α-SiC substrate respectively. An r-plane sapphire substrate formed with a nitride-based semiconductor whose main surface is the a-plane may be employed as the substrate. A $LiAlO_2$ substrate or a $LiGaO_2$ substrate formed with the nitride-based semiconductor layers whose main surfaces are the a-planes and the m-planes can be employed as the substrate.

In the p-n junction nitride-based semiconductor laser device 10, the first semiconductor layer 2 and the second semiconductor layer 4 have different conductivity. The first semiconductor layer 2 may be p-type and the second semiconductor layer 4 may be n-type, or the first semiconductor layer 2 may be n-type and the second semiconductor layer 4 may be p-type.

The first semiconductor layer 2 and the second semiconductor layer 4 may include cladding layers (not shown) having band gaps larger than that of the emission layer 3. Further, each of the first semiconductor layer 2 and the second semiconductor layer 4 may include a cladding layer and a contact layer (not shown) successively from the emission layer 3. In this case, the contact layer preferably has a smaller band gap than the cladding layer.

In the emission layer 3 of the quantum well, GaInN can be employed as a well layer, and AlGaN, GaN and GaInN having band gaps larger than that of the well layer can be employed as the barrier layer. GaN and AlGaN can be employed as the cladding layer and the contact layer.

The nitride-based semiconductor layer 5 may be formed by a wurtzite nitride-based semiconductor layer made of InGaN, AlN, InN, BN, TlN or an alloyed semiconductor of these. The second electrode 8 may be formed on a part of a region on the second semiconductor layer 4. When the semiconductor device is a light-emitting diode (LED), the second electrode 8 of a light extraction surface (upper surface) preferably has translucence.

While the light-emitting device (laser device) is employed as the nitride-based semiconductor device in the aforementioned description, the present invention may be applicable to a electronic device such as a transistor or a photodetector such as a photodiode or a solar cell.

Figure 2:
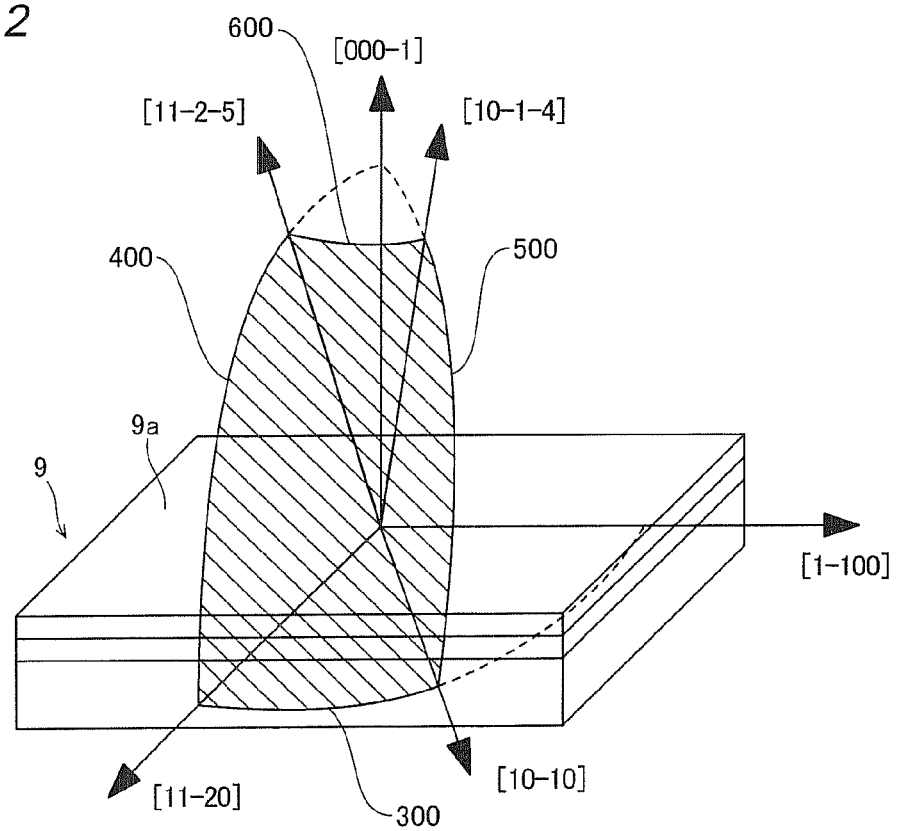
FIG. 2 is a diagram showing crystal orientations of a nitride-based semiconductor and areas of normal directions of a main surface of a substrate of a nitride-based semiconductor light-emitting device of the present invention.

The plane orientation of the substrate of the nitride-based semiconductor device according to the present invention will be now described with reference to FIG. 2.

Normal directions of a main surface of a semiconductor layer shown by reference number 9a or a surface of a growth substrate 9 is a direction passing through an area enclosed with a line 300, a line 400, a line 500 and a line 600 (region hatched by slant lines). The line 300 is a line connecting a [11-20] direction and a substantially [10-10] direction and the direction passing through the line 300 is a [C+D, C, −2C−D, 0] direction (C and D satisfy C≧0 and D≧0, and at least either one of C and D is a nonzero integer). The line 400 is a line connecting a [11-20] direction and a substantially [11-2-5] direction, and the direction passing through the line 400 is a [1, 1, −2, −E] direction (0≦E≦5)). The line 500 is a line connecting a [10-10] direction and a substantially [10-1-4] direction, and the direction passing through the line 500 is a [1, −1, 0, −F] direction (0≦F≦4)). The line 600 is a line connecting a substantially [11-2-5] direction and a substantially [10-1-4] direction, and the direction passing through the line 600 is a [G+H, G, −2G−H, −5G−4H] direction (G and H satisfy G≧0 and H≧0, and at least either one of G and H is a nonzero integer)).

A method of manufacturing the nitride-based semiconductor laser device 10, which is an example of a schematic method of manufacturing the semiconductor device according to the present invention, will be now described with reference to FIGS. 1 and 3.

Figure 3:
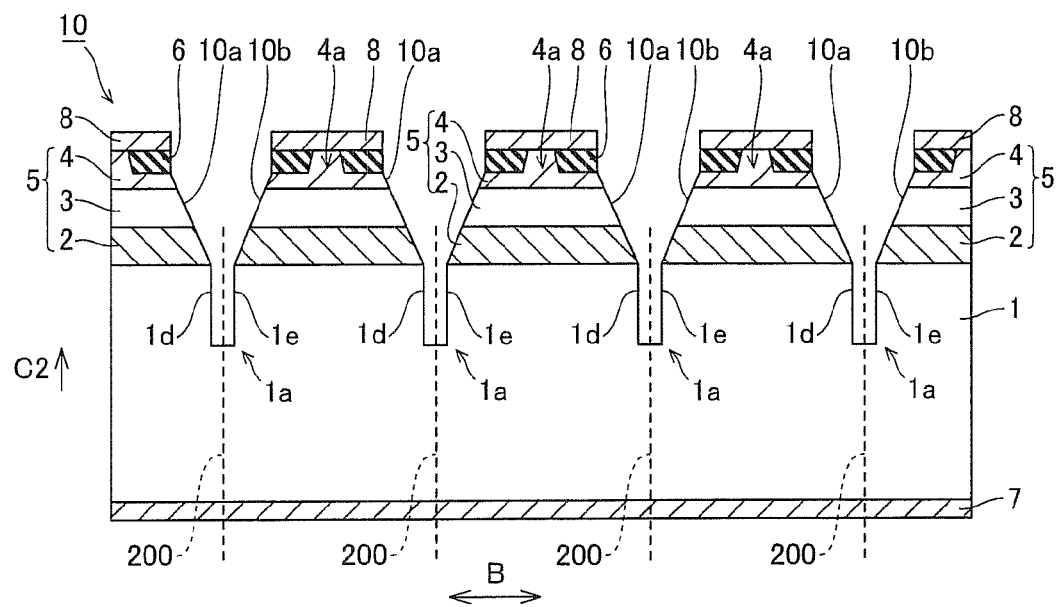
FIG. 3 is a sectional view for schematically illustrating a manufacturing process for the semiconductor device according to the present invention.

As shown in FIG. 3, the nitride-based semiconductor layer 5 is formed on an upper surface of the growth substrate 1 formed with a plurality of recess portions 1a extending in a prescribed direction (direction A in FIG. 1) to have the side surfaces 10a and the side surfaces 10b. At this time, a buffer layer may be formed between the growth substrate 1 and the first semiconductor layer 2.

More specifically, the main surface of the semiconductor layer or the surface of the growth substrate 1 is formed by an a-plane ((11-20) plane), so that the side surfaces 10a having a (000-1) plane starting from the side walls 1d of the recess portions 1a and the side surfaces 10b having the (11-22) plane starting from the side walls 1e of the recess portions 1a can be formed. The main surface of the semiconductor layer or the surface of the growth substrate 1 is formed by an m-plane ((1-100) plane), so that the side surfaces 10a having the (000-1) plane starting from the side walls 1d of the recess portions 1a and the side surfaces 10b having the (1-101) plane starting from the side walls 1e of the recess portions 1a can be formed. The main surface of the semiconductor layer or the surface of the growth substrate 1 is formed by a (11-2-2) plane, so that the side surfaces 10a having the (000-1) plane starting from the side walls 1d of the recess portions 1a and the side surfaces 10b having the (11-22) plane starting from the side walls 1e of the recess portions 1a can be easily formed. The main surface of the semiconductor layer or the surface of the growth substrate 1 is formed by a (1-10-2) plane, so that the side surfaces 10a having the (000-1) plane starting from the side walls 1d of the recess portions 1a and the side surfaces 10b having the (1-101) plane starting from the side walls 1e of the recess portions 1a can be easily formed.

More specifically, the nitride-based semiconductor layer 5 may be formed after forming groove portions (recess portions) on the main surface perpendicular to a (000±1) plane of the n-type GaN substrate such as the m-plane ((1-100) plane) or the a-plane ((11-20) plane), for example. Alternatively, the nitride-based semiconductor layer 5 may be formed on the main surface perpendicular to the (000±1) plane of the n-type GaN substrate such as the a-plane ((11-20) plane) through an underlayer.

The side walls 1d of the growth substrate 1 are formed by the (000-1) plane, whereby the (000-1) plane of the semiconductor layer is so formed as to take over the side walls 1d having the (000-1) plane when the nitride-based semiconductor layer 5 having the side surfaces 10a having the (000-1) plane on the main surface of the growth substrate 1, and hence the side surfaces 10a having the (000-1) plane can be easily formed on the surface of the growth substrate 1.

When the semiconductor layer is formed by a wurtzite nitride-based semiconductor, a nitride-based semiconductor substrate or a substrate made of a material other than nitride-based semiconductor can be employed as the growth substrate 1. A α-SiC, GaAs, GaP, InP, Si, sapphire, spinel, or LiAlO$_2$ substrate having a hexagonal structure or a rhombohedral structure can be employed as the substrate made of a material other than a nitride-based semiconductor, for example. An r-plane ((1-102) plane) sapphire substrate previously growing a nitride-based semiconductor whose main surface is an a-plane ((11-20) plane) or an a-plane SiC substrate or an m-plane SiC substrate previously growing a nitride-based semiconductor whose main surface is an a-plane or an m-plane ((1-100) plane) may be employed. A (100) plane substrate such as a LiAlO$_2$ or a LiGaO$_2$ substrate, previously growing the nitride-based semiconductor whose main surface is an m-plane can be used. A nitride-based semiconductor layer having most excellent crystallinity can be obtained by employing the nitride-based semiconductor substrate.

Thereafter, prescribed regions of the upper surface of the second semiconductor layer 4 are dry etched as shown in FIG. 3. Thus, a plurality of the ridge portions 4a are formed by the projecting portions of the second semiconductor layer 4. Then the current blocking layer 6 is so formed as to cover the upper surfaces of planar portions other than projecting portions of the second semiconductor layer 4 and the both side surfaces of the ridge portions 4a. Therefore, the first electrode 7 is formed on the lower surface of the first semiconductor layer 2, and the second electrodes 8 are formed on the current blocking layer 6.

Finally, the nitride-based semiconductor laser device 10 in a wafer state shown in FIG. 3 is cleaved in a bar-shape and the device is divided along the cavity direction (extensional direction of the ridge portion 4a) along parting lines 200 (shown by broken lines) of the recess portions 1a of the growth substrate 1, thereby forming the individual nitride-based semiconductor laser device 10 separated into chips shown in FIG. 1.

As hereinabove described, the nitride-based semiconductor laser device 10 according to the present invention comprises the nitride-based semiconductor layer 5 formed with the side surface 10a starting from the side wall id of the step portion 1b of the growth substrate 1 and the side surface 10b starting from the side wall 1e of the step portion 1c of the growth substrate 1. Thus, dissimilarly to a nitride-based semiconductor laser device obtained by forming dividing grooves on the semiconductor layer 5 by etching, mechanically scribing or laser scribing and being separated into chips, the side surfaces 10a and 10b are not side surfaces formed by the dividing grooves which are formed through the aforementioned method. Therefore, no defect caused on the emission layer 3 in forming the dividing grooves through the aforementioned method exists on the side surfaces 10a and 10b, and hence reduction in luminous efficiency of the nitride-based semiconductor laser device 10 can be suppressed. Thus, heat is unlikely to be abnormally generated in the nitride-based semiconductor laser device 10, and hence reduction in the life of the nitride-based semiconductor laser device 10 can be suppressed.

The manufacturing process for the nitride-based semiconductor laser device 10 according to the present invention comprises a step of growing the nitride-based semiconductor layer 5 including the side surfaces 10a and 10b formed while growing staring from the side walls 1d and 1e of the recess portions 1a of the growth substrate 1. Thus, when the nitride-based semiconductor layer 5 is crystal-grown on the growth substrate 1, the growth rate of forming the side surfaces 10a and 10b respectively is slower than the growth rate of growing the upper surface of the growth layer (main surface of the nitride-based semiconductor layer 5), and hence the upper surface (main surface) of the growth layer is grown while maintaining flatness. Thus, flatness of the surface of the semiconductor layer having the emission layer 3 can be more improved as compared with surfaces of a growth layer of a nitride-based semiconductor layer 5 without the side surfaces formed by the aforementioned side surfaces 10a and 10b. This reason is conceivable as follows:

While the plane having slow growth rate such as the (000-1) plane or the {A+B, A, −2A−B, 2A+B} plane conceivably has small surface energy, the plane having fast growth rate such as the (1-100) plane conceivably has large surface energy. The surface during crystal growth is stable when the surface energy is smaller, and hence the plane other than the (1-100) plane having smaller surface energy than the (1-100) plane is likely to appear when crystal growing only the aforementioned (1-100) plane employed as the growth plane. Consequently, flatness of the growth plane (main surface) is likely to be deteriorated. According to the present invention, on the other hand, the growth plane ((1-100) plane) is grown while forming the (000-1) plane or the {A+B, A, −2A−B, 2A+B} plane having surface energy smaller than the (1-100) plane grown as the main surface, for example, and hence surface energy of the growth plane (main surface) can be reduced as compared with a case of crystal growing only the aforementioned (1-100) plane as a growth plane. Thus, flatness of the growth plane is conceivably improved.

In the manufacturing process for the nitride-based semiconductor laser device 10 according to the present invention, the nitride-based semiconductor layer 5 is formed that the plane area of the nitride-based semiconductor layer 5 is reduced (tapered) in a direction (along arrow C2) away from the growth substrate 1 along a direction of stacking of the nitride-based semiconductor layer 5 by the side surfaces 10a and 10b, whereby larger spaces (upper regions of the recess portions 1a (see FIG. 3)) than the plane areas of the step portions 1b and 1c (recess portions 1a) are formed on the surface of the nitride-based semiconductor layer 5 on a side (along arrow C2) opposite to the growth substrate 1 by the side surfaces 10a and 10b, and hence the wafer can be easily divided between the side surfaces 10a and 10b when separating the nitride-based semiconductor device into chips.

Embodiments embodying the aforementioned concept of the present invention will be hereinafter described with reference to the drawings.

First Embodiment

A structure of a nitride-based semiconductor laser device 30 according to a first embodiment will be described with reference to FIGS. 4 and 5.

This nitride-based semiconductor laser device 30 according to the first embodiment is formed by a wurtzite nitride semiconductor whose a main surface is a (11-2-2) plane.

Figure 4:
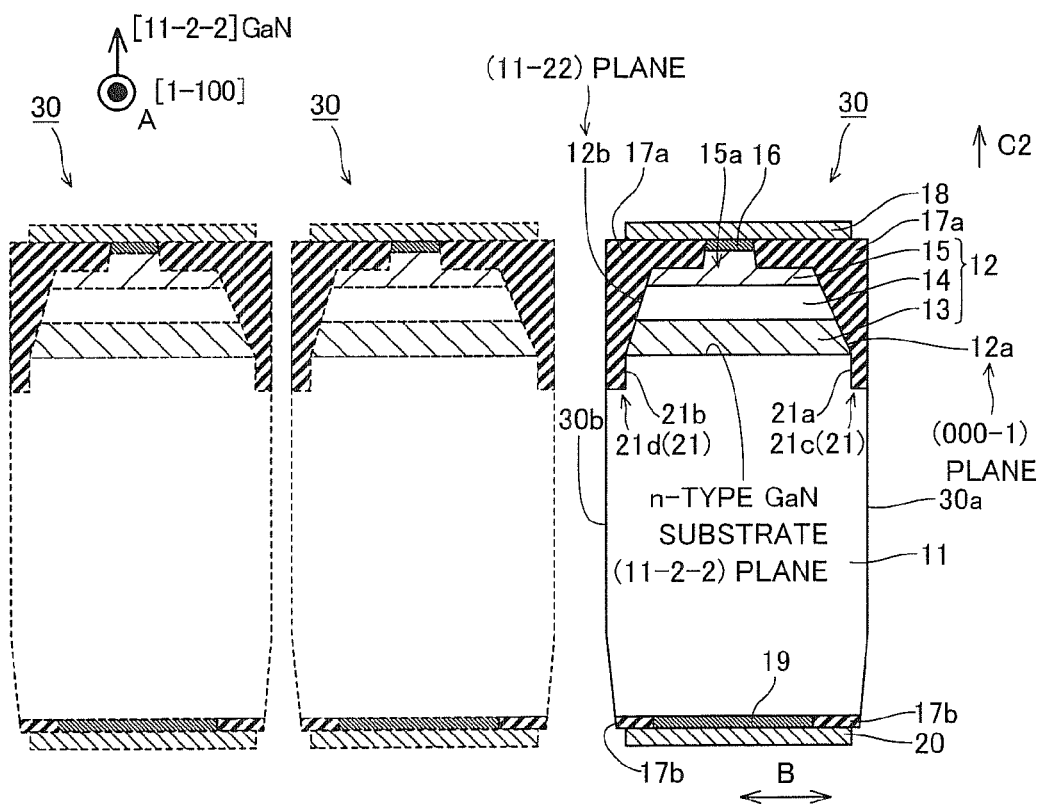
FIG. 4 is a sectional view showing a structure of a nitride-based semiconductor laser device according to a first embodiment of the present invention.

In the nitride-based semiconductor laser device 30, a light-emitting device layer 12 is formed on an n-type GaN substrate 11 having a thickness of about 100 μm, as shown in FIG. 4. The light-emitting device layer 12 is formed with an n-type cladding layer 13 made of n-type $Al_{0.05}Ga_{0.95}N$, having a thickness of about 2.0 μm and an emission layer 14 having an MQW structure in which a well layer (not shown) made of $Ga_{0.7}In_{0.3}N$ having a thickness of about 3 nm and a barrier layer (not shown) made of GaN having a thickness of about 20 nm are stacked. A p-type cladding layer 15 made of p-type $Al_{0.05}Ga_{0.5}N$, having a thickness of about 0.5 μm and including a projecting portion having a height (thickness) of about 0.4 μm and planar portions having a thickness of about 0.1 μm on both sides (direction B) of the projecting portion is formed on the emission layer 14. A ridge portion 15a employed as a current path is formed by the projecting portion of the p-type cladding layer 15. An optical waveguide is formed on a portion of the emission layer 14 located on a lower portion of the ridge portion 15a. The n-type GaN substrate 11 is an example of the "substrate" in the present invention, and the light-emitting device layer 12, the n-type cladding layer 13, the emission layer 14 and the p-type cladding layer 15 are examples of the "nitride-based semiconductor layer" in the present invention. The n-type cladding layer 13 and the p-type cladding layer 15 are examples of the "first semiconductor layer" and the "second semiconductor layer" in the present invention, respectively. A buffer layer (not shown) made of n-type $Al_{0.01}Ga_{0.99}N$ may be formed between the n-type GaN substrate 11 and the n-type cladding layer 13, or light guide layers (not shown) may be formed between the emission layer 14, the n-type cladding layer 13 and the p-type cladding layer 15, respectively. A cap layer (not shown) may be formed between the emission layer 14 and the p-type cladding layer 15. A p-side ohmic electrode 16 is formed on the projecting portion of the p-type cladding layer 15. A p-type contact layer may be formed between the p-type cladding layer 15 and the p-side ohmic electrode 16.

According to the first embodiment, side surfaces extending in a cavity direction ([1-100] direction (direction A)) of the nitride-based semiconductor laser device 30 are formed from the n-type cladding layer 13 to the p-type cladding layer 15 by a facet 12a having the (000-1) plane of the light-emitting device layer 12 and a facet 12b having the (11-22) plane formed on a region opposed to the facet 12a in a manufacturing process. The facets 12a and 12b are examples of the "first side surface" and the "second side surface" in the present invention, respectively.

The facets 12a and 12b are previously formed as inclined planes extending starting from inner side surfaces 21a and 21b of a groove portion 21 (step portions 21c and 21d) which is previously formed on the main surface of the n-type GaN substrate 11 in the manufacturing process described later and extends in the [1-100] direction (direction A) while inclining at a prescribed angle with respect to the main surface of the n-type GaN substrate 11. More specifically, the facet 12a extends while inclining at about 32° with respect to a [11-2-2] direction in which the upper surface (main surface) of the light-emitting device layer 12 is grown. The facet 12b extends while inclining at about 26° with respect to the [11-2-2] direction. Thus, the semiconductor laser device 30 has a shape in which sectional views in a direction (direction B) along the cavity facets are tapered along a direction (along arrow C2) away from the main surface of the n-type GaN substrate 11 at a portion of the light-emitting device layer 12, as shown in FIG. 4. The groove portion 21 and the inner side surfaces 21a and 21b are examples of the "recess portion", the "first side wall" and the "second side wall" in the present invention, respectively.

The facets 12a and 12b are formed to form obtuse angles with respect to the upper surface (main surface) of the light-emitting device layer 12. More specifically, the facet 12a is inclined at about 122° with respect to the upper surface of the light-emitting device layer 12 and the facet 12b is inclined at about 116° with respect to the upper surface of the light-emitting device layer 12. For simplified illustration purposes, although the components of one semiconductor laser device 30 are denoted by reference numerals in FIG. 4, other semiconductor laser devices 30 (outer shape is shown by broken lines) on the left of the one semiconductor laser device 30 also have the same structure.

As shown in FIG. 4, insulating films 17a made of $SiO_2$ are formed to have prescribed shapes while covering the both side surfaces of the p-side ohmic electrode 16, the both side surfaces of the projecting portion of the p-type cladding layer 15, the planar portions of the p-type cladding layer 15, the facets 12a and 12b and the inner side surfaces 21a and 21b of the groove portion 21. A p-side pad electrode 18 is formed to cover the upper surfaces of the p-side ohmic electrode 16 and the insulating films 17a. An n-side ohmic electrode 19 and an n-side electrode 20 are formed on a lower surface of the n-type GaN substrate 11 successively from the n-type GaN substrate 11. Insulating films 17b made of $SiO_2$ are formed on both sides (in the direction B) of the n-side ohmic electrode 19, respectively.

Figure 5:
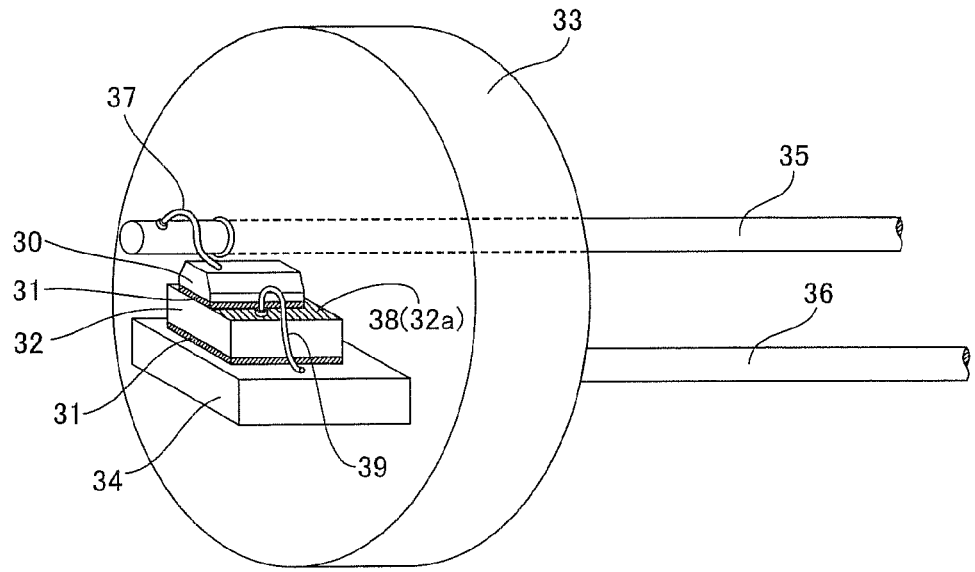
FIG. 5 is a perspective view showing a structure of a semiconductor laser comprising a nitride-based semiconductor laser device according to the first embodiment of the present invention.

In the semiconductor laser comprising the nitride-based semiconductor laser device 30 according to the first embodiment, the nitride-based semiconductor laser device 30 is fixed to a submount 32 through a conductive bonding layer 31 made of AuSn or the like, as shown in FIG. 5. The submount 32 is fixed to a seat portion 34 provided on a stem 33 made of metal through another conductive bonding layer 31. The stem 33 is provided with two lead terminals 35 and 36.

The upper surface of the nitride-based semiconductor laser device 30 is wire-bonded to the lead terminal 35 of the stem 33 with an Au wire 37, as shown in FIG. 5. An upper surface 32a of the submount 32 is wire-bonded to the seat portion 34 with an Au wire 39 through an underlying metal 38. A windowed cap (not shown) transmitting a laser beam is mounted on a body of the stem 33.

A manufacturing process for the nitride-based semiconductor laser device 30 according to the first embodiment will be now described with reference to FIGS. 4, 6 to 10.

Figure 6:
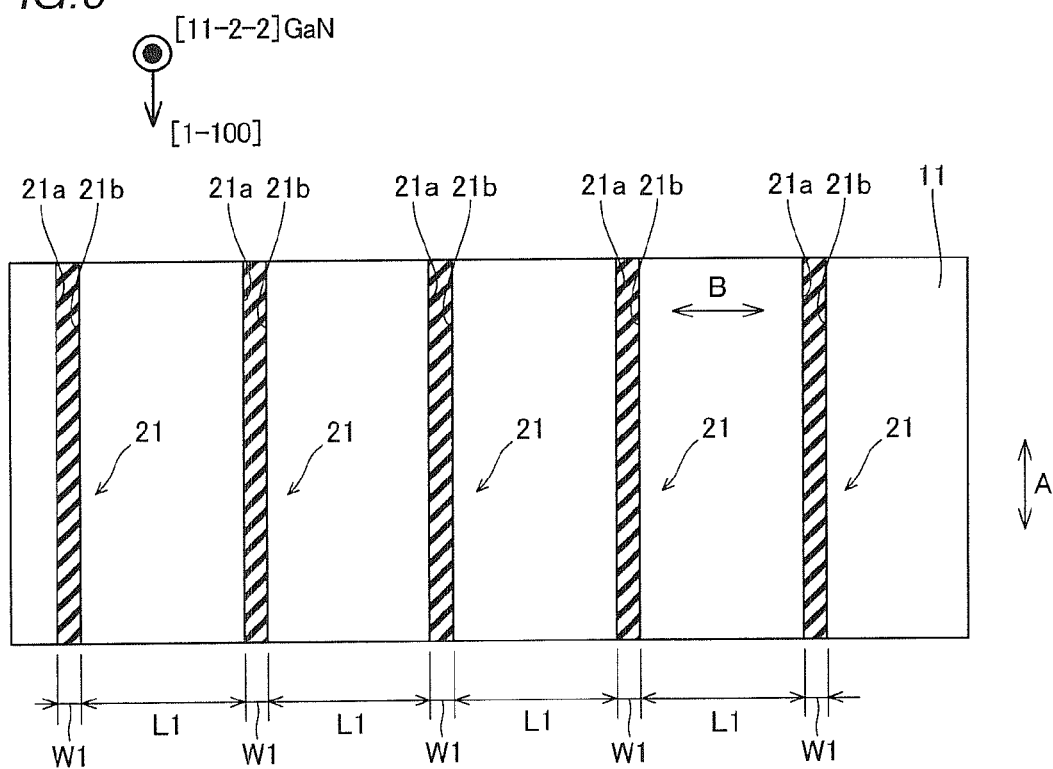
FIG. 6 is a plan view for illustrating a manufacturing process for the nitride-based semiconductor laser device according to the first embodiment of the present invention.
Figure 7:
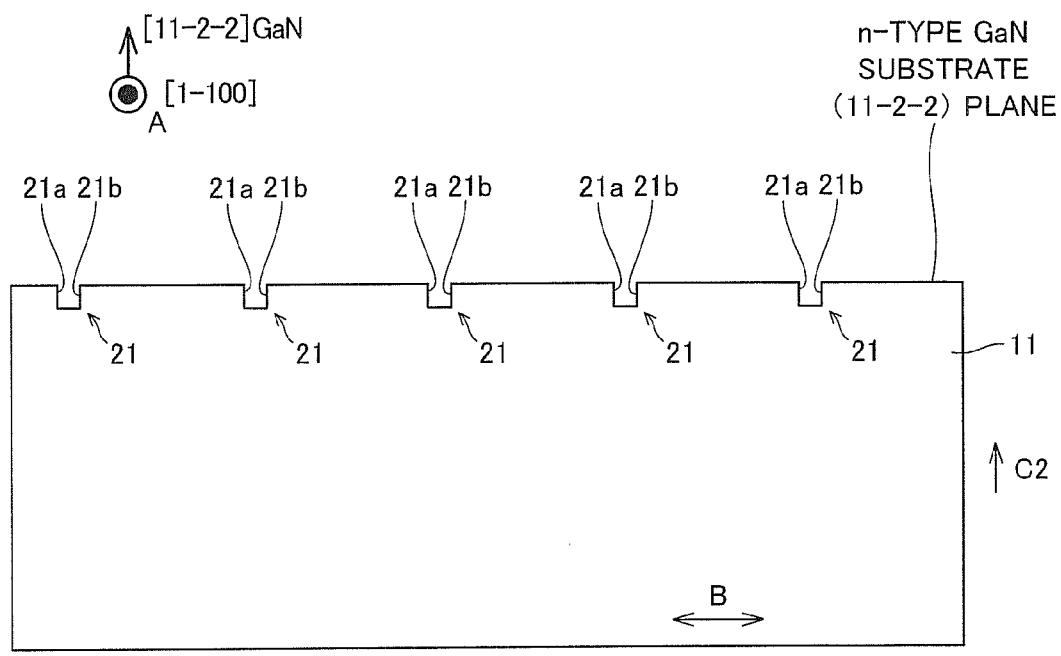
FIGS. 7 to 10 are sectional views for illustrating a manufacturing process for the nitride-based semiconductor laser device according to the first embodiment of the present invention.

As shown in FIGS. 6 and 7, a plurality of the groove portions 21 having a width W1 of about 5 μm in the direction B and a depth of about 2 μm and extending in the [1-100] direction (direction A) are formed on the main surface, having the (11-2-2) plane, of the n-type GaN substrate 11 by etching. In FIG. 6, portions of bold slant lines are regions which are etched as the groove portions 21. The groove portions 21 are formed in a striped manner in the direction B in the range of about 300 μm (=W1+L1 (L1=about 295 μm)). The interval for forming the groove portions 21 in the direction B may be in the range of about 2 μm to about 1 mm. Thus, the inner side surfaces 21a and 21b are formed on the groove portions 21 of the n-type GaN substrate 11, as shown in FIG. 7.

Figure 8:
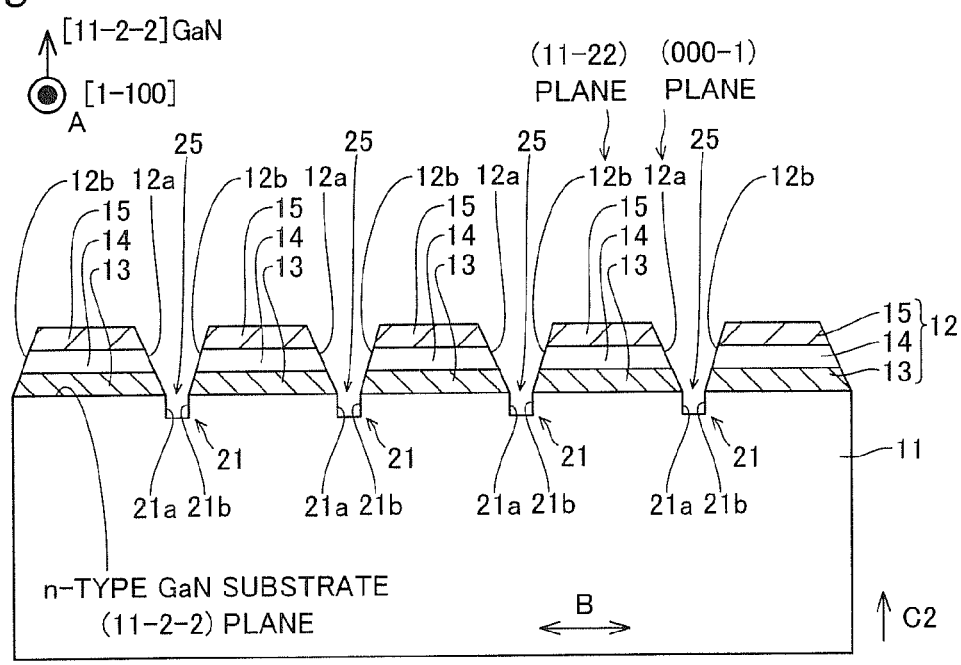

As shown in FIG. 8, the n-type cladding layer 13, the emission layer 14 and the p-type cladding layer 15 are successively stacked on the n-type GaN substrate 11 having the groove portions 21 by metal organic chemical vapor deposition (MOCVD), thereby forming the light-emitting device layer 12.

At this time, according to the first embodiment, when the light-emitting device layer 12 is grown on the n-type GaN substrate 11, the light-emitting device layer 12 is crystal-grown on the inner side surfaces 21a of the groove portions 21 extending in the [1-100] direction in a striped manner while forming the facets 12a having the (000-1) plane extending in a direction inclined by a prescribed angle (about 32°) with respect to the [11-2-2] direction (along arrow C2) of the n-type GaN substrate 11, as shown in FIG. 8. On a side of the inner side surfaces 21b opposed to the inner side surfaces 21a of the groove portions 21, the light-emitting device layer 12 is crystal-grown while forming the facets 12b having the (11-22) plane extending in a direction inclined by a prescribed angle (about 26°) with respect to the [11-2-2] direction (along arrow C2) of the n-type GaN substrate 11. Thus, the facets 12a and 12b are formed to form obtuse angles with respect to the upper surface (main surface) of the light-emitting device layer 12 respectively.

Figure 9:
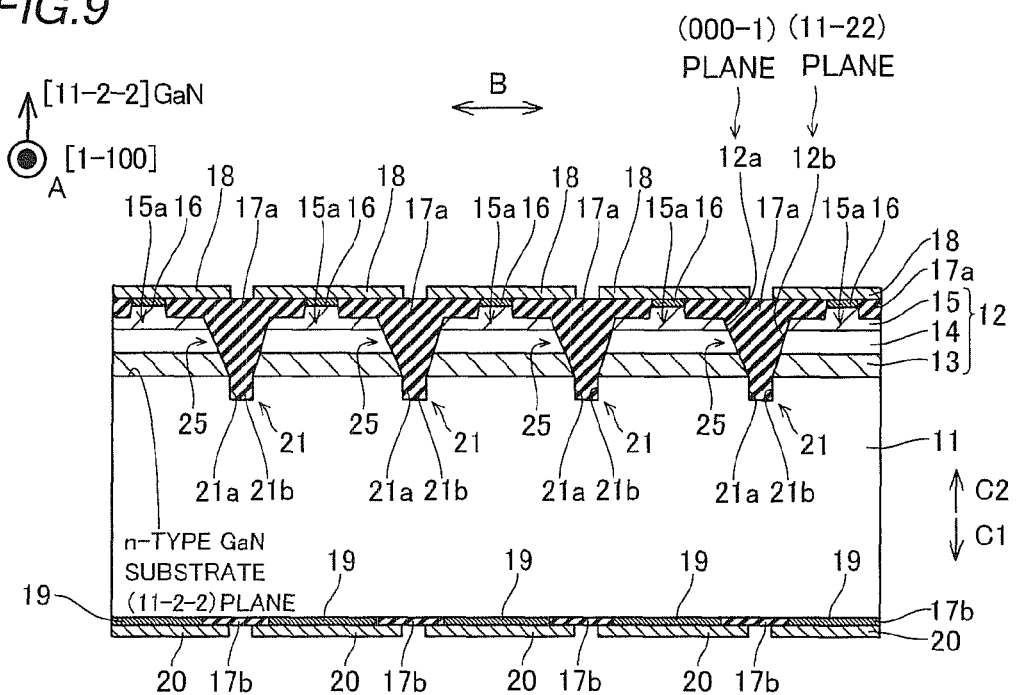

Thereafter, resist patterns (not shown) are formed on the upper surface of the p-type cladding layer 15 by photolithography, and prescribed regions are thereafter etched from the upper surface of the p-type cladding layer 15 along arrow C1 by employing the resist pattern as masks, as shown in FIG. 9. Thus, the ridge portions 15a constituted by the projecting portions of the p-type cladding layer 15 are formed. Then, the insulating films 17a made of $SiO_2$ are formed to cover the upper surface, including the projecting portion and the planar portion (including ridge portion 15a), of the p-type cladding layer 15, the facets 12a and 12b, the inner side surfaces 21a and 21b of the groove portions 21. At this time, the recess portions 25 (see FIG. 8) enclosed with the facets 12a and 12b and the groove portions 21 are completely filled up with the insulating films 17a.

Thereafter, the upper surface of the p-type cladding layer 15 are exposed by removing the insulating films 17a on the regions corresponding to the upper portions of the ridge portions 15a by etching, and the p-side ohmic electrodes 16 (see FIG. 9) are formed on the exposed ridge portions 15a, by vacuum evaporation. Then the p-side pad electrodes 18 (see FIG. 9) are formed along the upper surfaces of the p-side ohmic electrodes 16 and the upper surfaces of the insulating films 17a.

As shown in FIG. 9, the insulating films 17b made of $SiO_2$ are formed on the lower surface of the n-type GaN substrate 11. Thereafter, prescribed regions of the insulating films 17b are removed by etching, and the p-side ohmic electrodes 19 are formed on the removed portions (lower surface of the n-type GaN substrate 11) by vacuum evaporation. Further, the n-side electrodes 20 are formed on the p-side ohmic electrodes 19 and the insulating films 17b on both sides (direction B) of the p-side ohmic electrodes 19 by vacuum evaporation.

Figure 10:
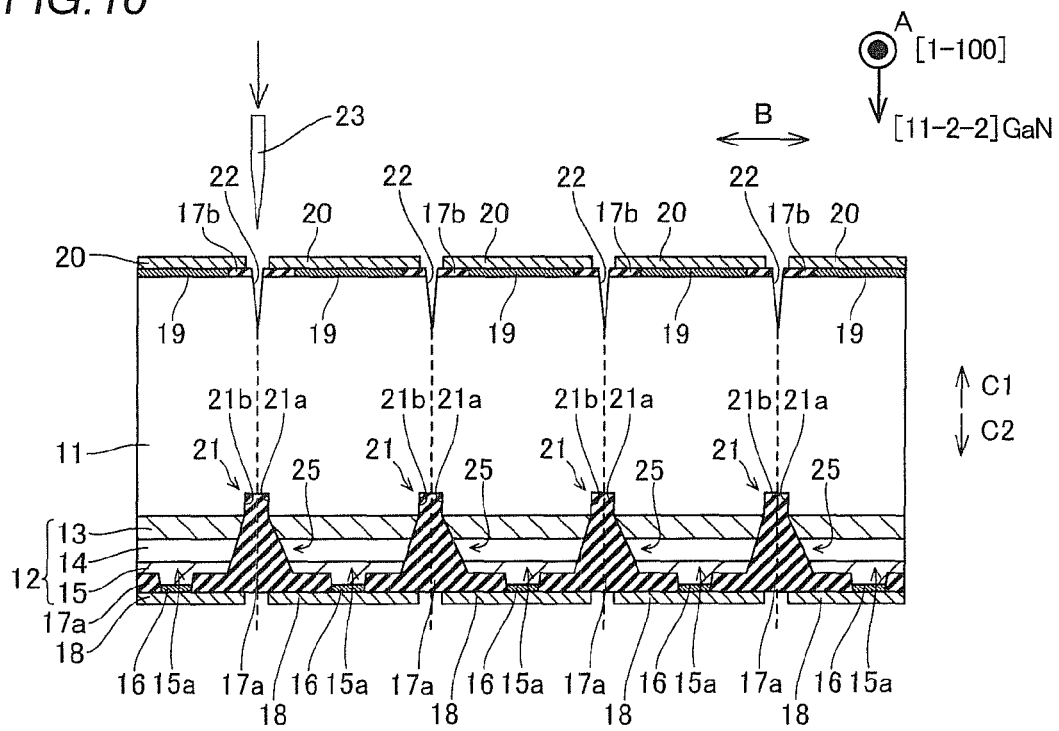

As shown in FIG. 10, linear scribed grooves 22 extending parallel to the groove portions 21 of the n-type GaN substrate 11 are formed on the insulating films 17b on the lower surface, opposed to the groove portions 21, of the n-type GaN substrate 11 by laser scribing or mechanical scribing such as diamond scribing. The scribed grooves 22 are formed to have depth reaching the n-type GaN substrate 11 on lower portions of the insulating films 17b.

Thereafter the nitride-based semiconductor laser device 30 in a wafer state shown in FIG. 10 is cleaved in a bar-shape, thereby forming the cavity facets. A tool having a sharp end, a wedge 23, for example, is pressed against the bar-shaped nitride-based semiconductor laser device 30 from above in a vertical direction (along arrow C2) as shown in FIG. 10, thereby separating the wafer at positions of the scribed grooves 22 (shown by broken lines) in direction B. Thus, the separated individual nitride-based semiconductor laser devices 30 shown in FIG. 4, are formed. The wafer is divided in the direction B, whereby the groove portions 21 are formed as the step portions 21c and 21d (see FIG. 4) which are parts of side end surfaces 30a and 30b of the nitride-based semiconductor laser device 30 in the direction B. The side end surfaces 30a and 30b are examples of the "first side end surface" and the "second side end surface" in the present invention respectively, and the step portions 21c and 21d are examples of the "first step portion" and the "second step portion" in the present invention, respectively.

According to the first embodiment, as hereinabove described, the nitride-based semiconductor laser device 30 comprises the light-emitting device layer 12 including the facets 12a and 12b starting from the inner side surfaces 21a and 21b of the groove portion 21 formed on the main surface of the n-type GaN substrate 11. Thus, dissimilarly to a nitride-based semiconductor laser device separated by forming dividing grooves on the semiconductor layer 12 by etching, mechanically scribing or laser scribing, the facets 12a and 12b are not side surfaces formed by the dividing grooves which are formed through the aforementioned method. Therefore, no defect caused on the emission layer 14 in forming the dividing grooves through the aforementioned method exists on the facets 12a and 12b, and hence reduction in luminous efficiency of the nitride-based semiconductor laser device 30 can be suppressed. Thus, heat is unlikely to be abnormally generated in the nitride-based semiconductor laser device 30, and hence reduction in the life of the nitride-based semiconductor laser device 30 can be suppressed.

The manufacturing process according to the first embodiment comprises a step of growing the light-emitting device layer 12 including the facets 12a and 12b formed while growing starting from the inner side surfaces 21a and 21b of the groove portions 21 formed on the main surface of the n-type GaN substrate 11. Thus, when the light-emitting device layer 12 is crystal-grown on the n-type GaN substrate 11, the growth rate of forming the facets 12a and 12b starting from the inner side surfaces 21a and 21b respectively is slower than the growth rate of growing the upper surface of the growth layer (main surface of the light-emitting device layer 12), and hence the upper surface (main surface) of the growth layer is grown while maintaining flatness. Thus, flatness of the surface of the light-emitting device layer 12 having the emission layer 14 can be more improved as compared with surfaces of a growth layer of a light-emitting device layer with no side surfaces formed by the aforementioned facets 12a and 12b.

According to the first embodiment, the facets 12b are formed by the (11-22) plane so that the light-emitting device layer 12 is grown on the surface of the n-type GaN substrate 11 formed with the groove portions 21, whereby the facet 12b having the (11-22) plane can be easily formed in addition to the facets 12a having the (000-1) plane.

According to the first embodiment, the facets 12a and 12b are formed to form obtuse angles with respect to the main surface (upper surface) of the light-emitting device layer 12, whereby the regions where the facets 12a and 12b are opposed to each other (upper regions of the groove portion 21 of the n-type GaN substrate 11 (recess portions 25 in FIG. 8)) are formed to expand from the n-type GaN substrate 11 toward the upper surface of the light-emitting device layer 12. Thus, the facets 12a and 12b can be inhibited from coming close to each other, and hence the nitride-based semiconductor laser device 30 can be divided on portions, where the insulating films 17a are formed, between the facets 12a and 12b, when separating the nitride-based semiconductor laser device 30 into chips.

According to the first embodiment, the facets 12a and 12b are formed by the facets of the light-emitting device layer 12, whereby two types of growth facets of the aforementioned facets 12a and 12b can be formed simultaneously with the crystal growth of the light-emitting device layer 12. A fine corrugated shape caused by etching, mechanical scribing or laser scribing is not formed on the facets 12a and 12b formed by the facets. Thus, defects and the like are not caused on the light-emitting device layer 12 (emission layer 14) resulting from the fine corrugated shape, and hence reduction in the luminous efficiency and the life of the nitride-based semiconductor laser device 30 can be further suppressed similarly to the aforementioned effects.

According to the first embodiment, the n-type GaN substrate 11 of a nitride-based semiconductor such as GaN is employed, whereby the light-emitting device layer 12 having the facets 12a having the (000-1) plane and the facets 12b having the (11-22) plane can be easily formed on the n-type GaN substrate 11 of the nitride-based semiconductor by utilizing crystal growth of the light-emitting device layer 12.

According to the first embodiment, the facets 12a and 12b are formed to extend along the extensional direction (direction A) of the ridge portion 15a and the optical waveguide, whereby the facets 12a and 12b extending along the extensional direction (direction A) of the ridge portion 15a and the optical waveguide can be utilized as the side surfaces of the individual nitride-based semiconductor laser devices 30 after device division in the direction A.

According to the first embodiment, the light-emitting device layer 12 are formed by the n-type cladding layer 13, the emission layer 14 and the p-type cladding layer 15 from the side of the n-type GaN substrate 11, and the ridge portion 15a extending in the direction A is formed on the p-type cladding layer 15, whereby the optical waveguide for emitting a laser beam, emitted from the emission layer 14 on the lower portion of the p-type cladding layer 15, outward can be easily formed by the ridge portion 15a formed on the p-type cladding layer 15.

According to the first embodiment, the step portions 21c and 21d are formed to extend along the extensional direction (direction A) of the optical waveguide, whereby the optical waveguide and the step portion 21c can not intersect with each other.

Second Embodiment

A light-emitting device layer 42 is formed after forming an underlayer 50 made of AlGaN on an n-type GaN substrate 11 in a second embodiment dissimilarly to the aforementioned first embodiment, which will be hereinafter described with reference to FIG. 11.

A nitride-based semiconductor laser device 40 according to the second embodiment is formed by a wurtzite nitride-based semiconductor whose main surface is a (11-2-2) plane.

Figure 11:
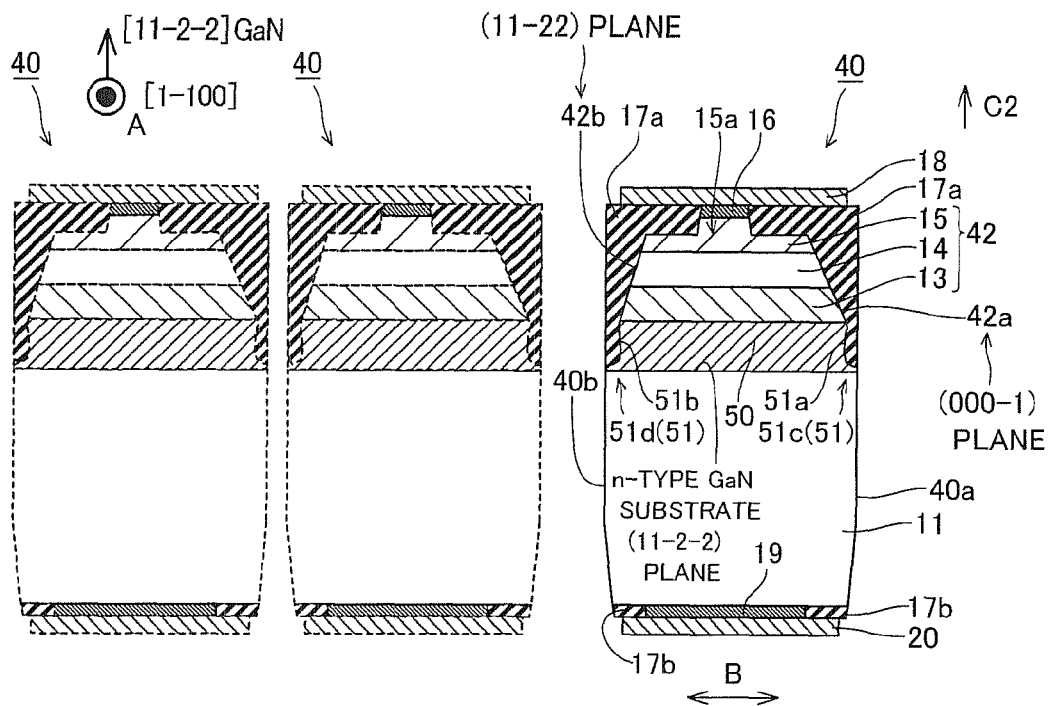
FIG. 11 is a sectional view showing a structure of a nitride-based semiconductor laser device according to a second embodiment of the present invention.

In the nitride-based semiconductor laser device 40, the emission layer 42 is formed on the n-type GaN substrate 11 having a thickness of about 100 μm through the underlayer 50 made of $Al_{0.05}Ga_{0.95}N$ having a thickness of about 3 to 4 μm, as shown in FIG. 11. On this underlayer 50, a plurality of groove-shaped cracks 51 are so formed as to extend in a cavity direction (direction perpendicular to the plane of FIG. 11). The cracks 51 are examples of the "recess portion" in the present invention. The n-type GaN substrate 11 according to the second embodiment is an example of the "base substrate" in the present invention. The light-emitting device layer 42 includes an n-type cladding layer 13, an emission layer 14 and a p-type cladding layer 15 similarly to the aforementioned first embodiment.

According to the second embodiment, side surfaces extending in a cavity direction of the nitride-based semiconductor laser device 40 are formed from the n-type cladding layer 13 to the p-type cladding layer 15 by a facet 42a having the (000-1) plane of the light-emitting device layer 42 and a facet 42b having the (11-22) plane formed on a region opposed to the facet 42a. The facets 42a and 42b are examples of the "first side surface" and the "second side surface" in the present invention, respectively. For simplified illustration purposes, although the components of one semiconductor laser device 40 are denoted by reference numerals in FIG. 11, other semiconductor laser devices 40 (outer shape is shown by broken lines) on the left of the one semiconductor laser device 30 also have the same structure. The remaining structure of the nitride-based semiconductor laser device 40 according to the second embodiment is similar to that of the aforementioned first embodiment.

A manufacturing process for the nitride-based semiconductor laser device 40 according to the second embodiment will be now described with reference to FIGS. 11 to 13.

Figure 12:
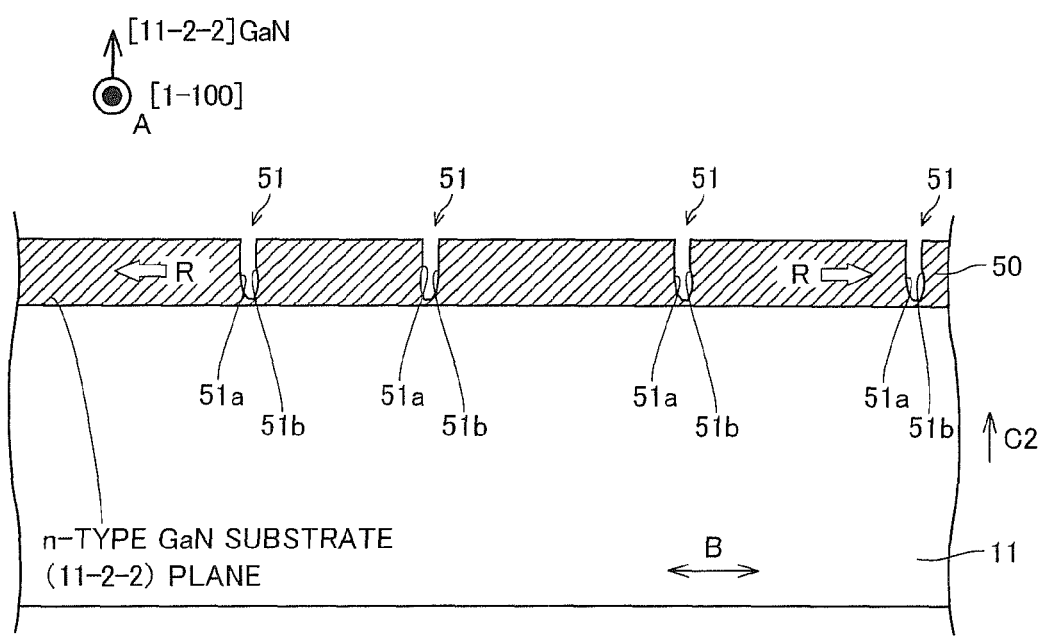
FIGS. 12 and 13 are sectional views for illustrating a manufacturing process for the nitride-based semiconductor laser device according to the second embodiment of the present invention.

In the manufacturing process according to the second embodiment, the underlayer 50 made of $Al_{0.05}Ga_{0.95}N$ having a thickness of about 3 to about 4 μm is grown on the n-type GaN substrate 11, as shown in FIG. 12. A lattice constant $c_2$ of the underlayer 50 is smaller than a lattice constant $c_1$ of the n-type GaN substrate 11 ($c_1 > c_2$) when the underlayer 50 is crystal-grown, and hence tensile stress R (see FIG. 12) is caused inside the underlayer 50, a thickness of which reaches a prescribed thickness, in response to the lattice constant cl of the n-type GaN substrate 11. Consequently, the cracks 51 as shown in FIG. 12 are formed on the underlayer 50 following to local contraction of the underlayer 50 in a direction B. Difference between c-axial lattice constants of GaN and AlGaN is larger than difference between a-axial lattice constants of GaN and AlGaN, and hence the cracks 51 are likely to be formed in a [1-100] direction (direction A) parallel to a (0001) plane of the underlayer 50 and a (11-2-2) plane of the main surface of the n-type GaN substrate 11. FIG. 12 schematically shows a state of voluntarily forming the cracks 51 on the underlayer 50.

When the n-type GaN substrate 11 formed with the cracks 51 is viewed in a planar manner, the cracks 51 are formed to extend in a striped manner along the [1-100] direction (direction A) substantially orthogonal to the direction B of the n-type GaN substrate 11, similarly to the formation state of the groove portions 21 shown in FIG. 6.

Figure 13:
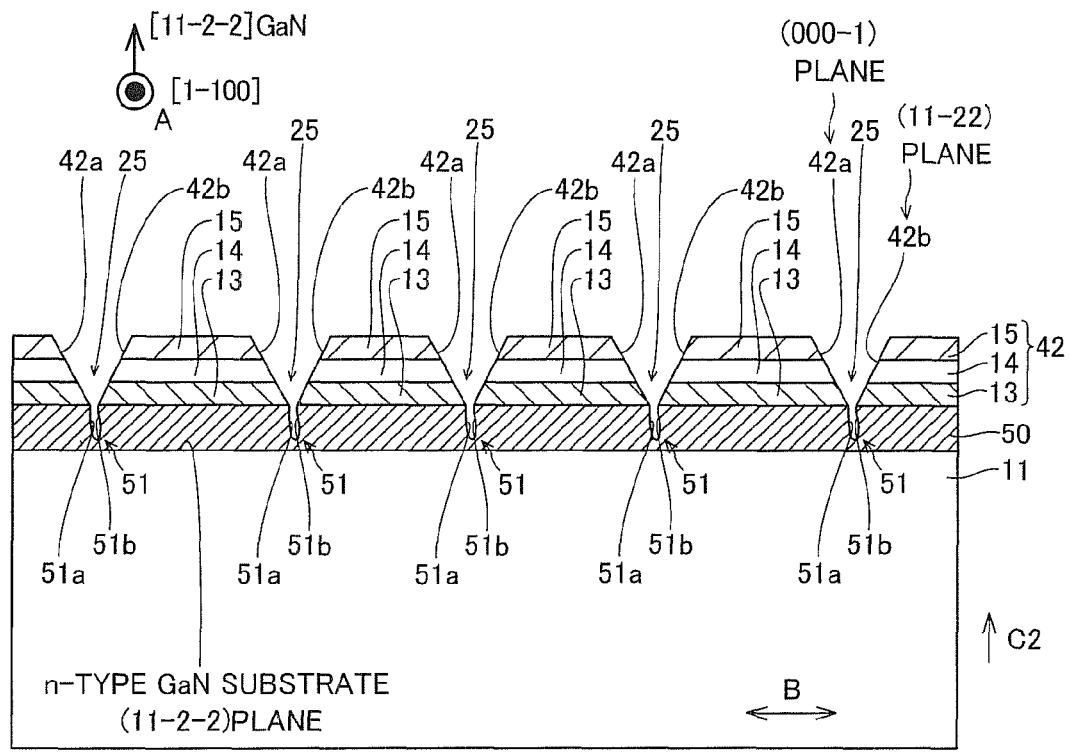

Thereafter, the light-emitting device layer 42 is formed through a manufacturing process similar to that of the aforementioned first embodiment, as shown in FIG. 13. The light-emitting device layer 42 is an example of the "nitride-based semiconductor layer" in the present invention.

At this time, according to the second embodiment, the light-emitting device layer 42 is crystal-grown on inner side surfaces 51a of the cracks 51 extending in the striped manner in the [1-100] direction while forming the facets 42a having the (000-1) plane extending in a direction inclined by a prescribed angle (about 32°) with respect to a [11-2-2] direction (along arrow C2) of the n-type GaN substrate 11. The light-emitting device layer 42 is crystal-grown on inner side surfaces 51b of the cracks 51, opposed to the inner side surfaces 51a of the cracks 51, while forming the facets 42b having the (11-22) plane extending in a direction inclined by a prescribed angle (about 26°) with respect to the [11-2-2] direction (along arrow C2) of the n-type GaN substrate 41. The inner side surfaces 51a and 51b are examples of the "first side wall" and the "second side wall" in the present invention respectively. Thus, the facets 42a and 42b are formed so as to form obtuse angles with respect to the upper surface (main surface) of the light-emitting device layer 42 respectively, similarly to the aforementioned first embodiment.

Thereafter, the nitride-based semiconductor laser device 40 in a wafer state is cleaved in a bar-shaped and divided through a manufacturing process similar to the aforementioned first embodiment. Thus, individual nitride-based semiconductor laser device 40 separated into chips, shown in FIG. 11, is formed. The wafer is divided in the direction B, whereby the cracks 51 are formed as step portions 51c and 51d (see FIG. 11) which are parts of side end surfaces 40a and 40b of the nitride-based semiconductor laser device 40 in the direction B. The side end surfaces 40a and 40b are examples of the "first side end surface" and the "second side end surface" in the present invention respectively, and the step portions 51c and 51d are examples of the "first step portion" and the "second step portion" in the present invention respectively.

According to the second embodiment, as hereinabove described, the nitride-based semiconductor laser device 40 comprises the n-type GaN substrate 11 formed with the cracks 51 on the underlayer 50 and the light-emitting device layer 42 including the facets 42a and 42b starting from the inner side surfaces 51a and 51b of the cracks 51 formed on the main surface of the n-type GaN substrate 11. Thus, dissimilarly to a nitride-based semiconductor laser device separated by forming dividing grooves on the light-emitting device layer 42 by etching, mechanical scribing or laser scribing, the facets 42a and 42b are not side surfaces formed by the dividing grooves which are formed through the aforementioned method. Therefore, no defect caused on the emission layer 14 in forming the dividing grooves through the aforementioned method exists on the facets 42a and 42b, and hence reduction in luminous efficiency of the nitride-based semiconductor laser device 40 can be suppressed. Thus, heat is unlikely to be abnormally generated in the nitride-based semiconductor laser device 40, and hence reduction in the life of the nitride-based semiconductor laser device 40 can be suppressed.

According to the second embodiment, the underlayer 50 made of AlGaN is formed on the n-type GaN substrate 11 and the lattice constant $c_1$ of the n-type GaN substrate 11 and the lattice constant $c_2$ of the underlayer 50 satisfy relation of $c_1 > c_2$, and the facets 42a and 42b of the light-emitting device layer 42 are formed starting from the inner side surfaces 51a and 51b of the cracks 51 respectively. Thus, when forming the underlayer 50 made of AlGaN on n-type GaN substrate 11, the lattice constant $c_2$ of the underlayer 50 is smaller than the lattice constant $c_1$ of the n-type GaN substrate 11 ($c_1 > c_2$), and hence tensile stress R is caused inside the underlayer 50 in response to the lattice constant $c_1$ of the n-type GaN substrate 11. Consequently, when the thickness of the underlayer 50 is at least a prescribed thickness, the underlayer 50 can not withstand this tensile stress R and the cracks 51 are formed on the underlayer 50. Thus, the inner side surfaces 51a and 51b which are starting points for crystal growing the facets 42a and 42b ((000-1) plane and (11-22) plane)) of the light-emitting device layer 42 on the underlayer 50 can be easily formed on the underlayer 50.

According to the second embodiment, the facets 42a and 42b are formed so as to form obtuse angles with respect to the main surface (upper surface) of the light-emitting device layer 42, whereby the regions where the facets 42a and 42b are opposed to each other (upper regions of the cracks 51 of the underlayer 50 (recess portions 25 in FIG. 12)) are formed to expand from the n-type GaN substrate 11 toward the upper surface of the light-emitting device layer 42. Thus, the facets 42a and 42b can be easily inhibited from coming close to each other, and hence the nitride-based semiconductor laser device 40 can be easily divided on portions, where insulating films 17a are formed, between the facets 42a and 42b, when separating the nitride-based semiconductor laser device 40 into chips. The remaining effects of the second embodiment are similar to those of the aforementioned first embodiment.

Third Embodiment

In a manufacturing process for a nitride-based semiconductor laser device 60 according to a third embodiment, positions of forming cracks 71 are controlled by forming scribed grooves 70 of dashed line shapes on an underlayer 50 on an n-type GaN substrate 61 dissimilarly to the aforementioned second embodiment, which will be hereinafter described with reference to FIGS. 12 and 14 to 16. The n-type GaN substrate 61 is an example of the "base substrate" in the present invention, and the cracks 71 are examples of the "recess portion" in the present invention.

This nitride-based semiconductor laser device 60 according to the third embodiment is formed by a wurtzite nitride-based semiconductor whose main surface is a (1-10-2) plane.

The remaining structure of the nitride-based semiconductor laser device 60 according to the third embodiment is similar to that of the aforementioned second embodiment.

In a manufacturing process for the nitride-based semiconductor laser device 60 according to the third embodiment, the underlayer 50 made of AlGaN having a critical thickness smaller than the thickness (about 3 to 4 μm) of the underlayer formed in the aforementioned second embodiment is grown on the n-type GaN substrate 61 (see FIG. 14), similarly to the case shown in FIG. 8. At this time, tensile stress R (see FIG. 12) is caused inside the underlayer 50 by action similar to that of the second embodiment. The critical thickness means a minimum thickness of the semiconductor layer, not causing cracks on semiconductor layers due to difference in lattice constants when stacking the semiconductor layers having different lattice constants from each other.

Figure 15:
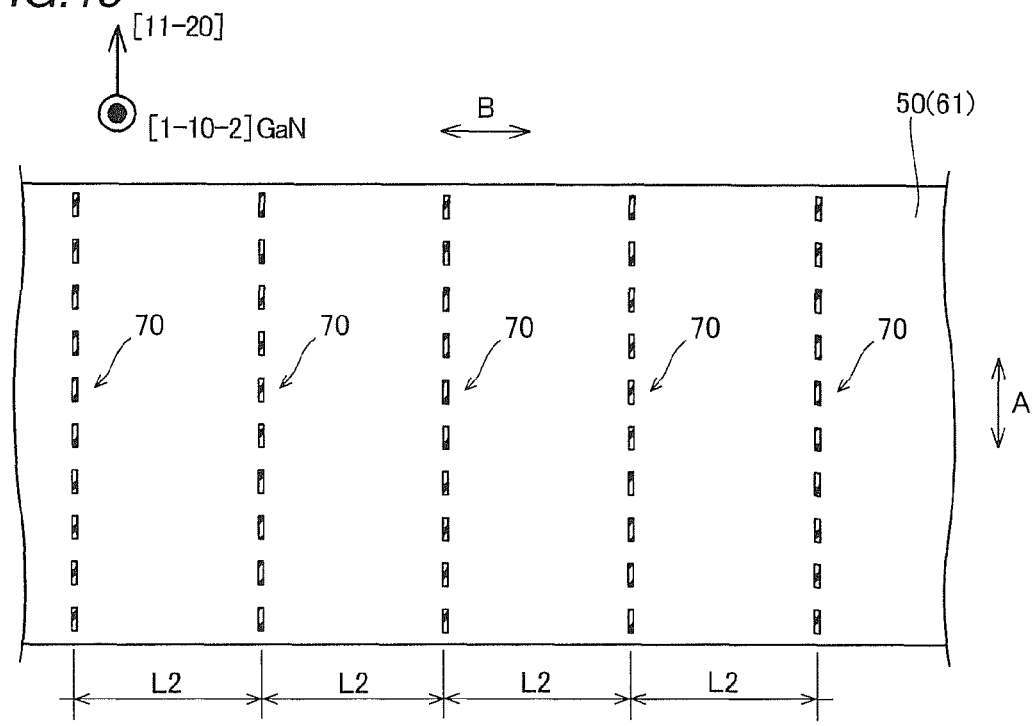
FIGS. 15 and 16 are plan views for illustrating a manufacturing process for the nitride-based semiconductor laser device according to the third embodiment of the present invention.
Figure 16:
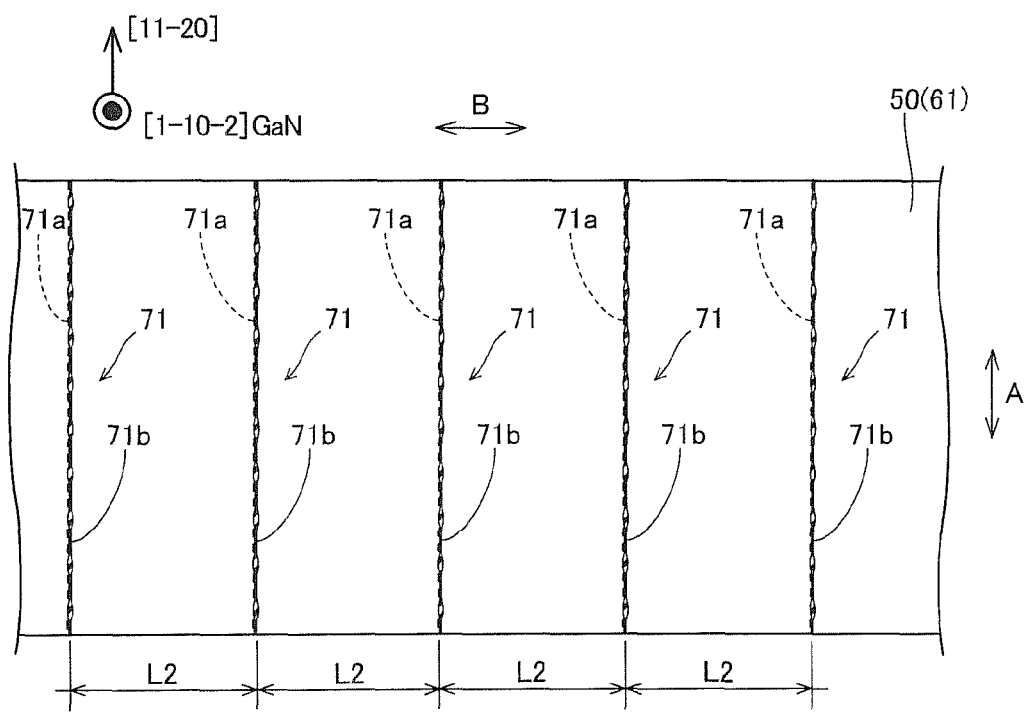

Thereafter, the scribed grooves 70 of dashed line shapes are formed on the underlayer 50 in a [11-20] direction (direction A) orthogonal to a direction B at an interval of about 50 μm by a laser beam or a diamond point, as shown in FIG. 15. A plurality of the scribed grooves 70 are formed at an interval L2 in the direction B. Thus, formation of the cracks 70 proceeds on regions, where no scribed grooves 70 are formed, of the underlayer 50, starting from the scribed grooves 70 of dashed line shapes, as shown in FIG. 16. Consequently, the substantially linear cracks 71 (see FIG. 16) dividing the underlayer 50 in the direction A are formed. The cracks 71 are examples of the "recess portion" in the present invention.

At this time, division of the scribed grooves 70 also proceeds in a depth direction (direction perpendicular to the plane of FIG. 16). Thus, inner side surfaces 71a and 71b (shown by broken lines) reaching the vicinity of an interface between the underlayer 50 and the n-type GaN substrate 61 are formed on the cracks 71. The inner side surfaces 71a and 71b are examples of the "first side wall" and the "second side wall" in the present invention respectively.

Thereafter, the light-emitting device layer 42 is formed on the underlayer 50 through a manufacturing process similar to the aforementioned second embodiment.

Figure 14:
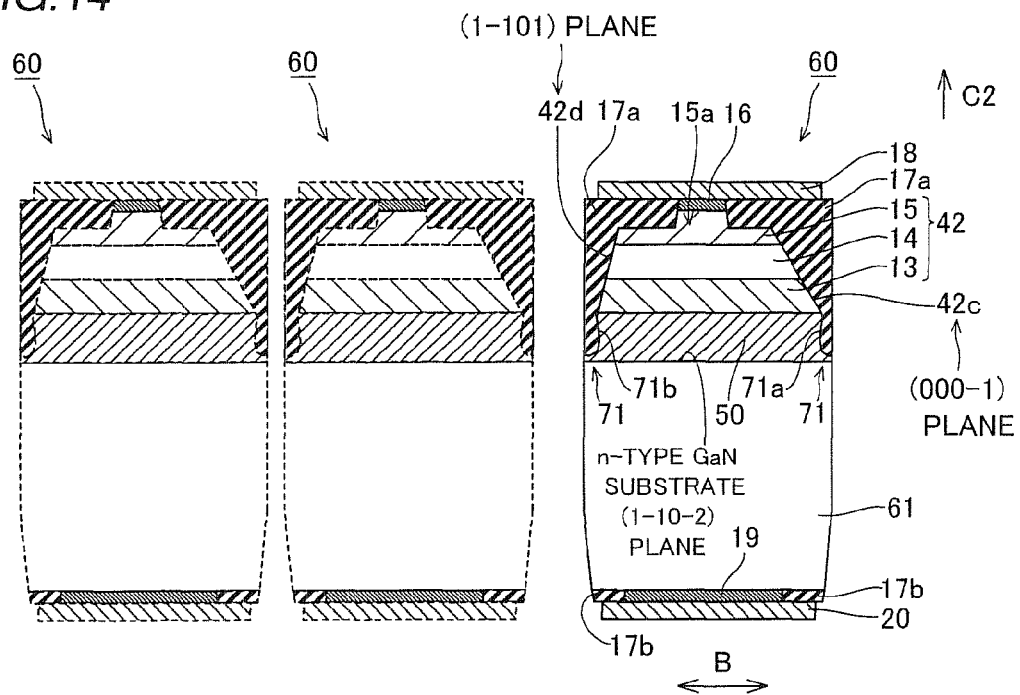
FIG. 14 is a sectional view showing a structure of a nitride-based semiconductor laser device according to a third embodiment of the present invention.

At this time, facets 42c having a (000-1) plane extending in a direction inclined at a prescribed angle (about 47°) with respect to a [1-10-2] direction (along arrow C2) of the n-type GaN substrate 61 and facets 42d having a (1-101) plane extending in a direction inclined at a prescribed angle (about 15°) with respect to a [1-10-2] direction (along arrow C2) of the n-type GaN substrate 61 are formed on the light-emitting device layer 42 on the n-type GaN substrate 61, as shown in FIG. 14. The facets 42c and 42d are examples of the "first side surface" and the "second side surface" in the present invention respectively.

The remaining manufacturing process of the third embodiment is similar to that of the aforementioned second embodiment. Thus, the nitride-based semiconductor laser devices 60 according to the third embodiment shown in FIG. 14 are formed.

According to the third embodiment, as hereinabove described, the facets 42d are formed by the (1-101) plane, whereby the facets 42d having the (1-101) plane can be easily formed in addition to the facets 42c having the (000-1) plane by growing the light-emitting device layer 42 on the surface of the n-type GaN substrate 61 formed with the cracks 71.

The manufacturing process of the third embodiment comprises a step of forming the underlayer 50 on the n-type GaN substrate 61 to have the critical thickness in forming the cracks 71 and thereafter forming a plurality of the scribed grooves 70 of dashed line shapes (at an interval of about 50 μm), which extend in the [11-20] direction (direction A), on the underlayer 50 at the interval L2 in the direction B. Thus, the cracks 71 formed parallel to the direction A starting from the scribed grooves 70 of dashed line shapes are formed on the underlayer 50 at regular intervals along the direction B. In other words, a plurality of the nitride-based semiconductor laser devices 60 (see FIG. 14) having the same width (width of the device in a direction along the cavity facet) can be more easily formed as compared with a case of stacking the semiconductor layer by utilizing cracks voluntarily formed as in the aforementioned second embodiment. The remaining effects of the third embodiment are similar to those of the aforementioned second embodiment.

Fourth Embodiment

In a fourth embodiment, an underlayer 50 made of AlGaN is formed on an n-type GaN substrate 81 whose main surface is an m-plane ((1-100) plane) and thereafter a light-emitting device layer 82 is formed dissimilarly to the aforementioned first embodiment, which will be hereinafter described with reference to FIG. 17. The n-type GaN substrate 81 and the light-emitting device layer 82 are examples of the "base substrate" and the "nitride-based semiconductor layer" in the present invention respectively.

A nitride-based semiconductor laser device 80 according to the fourth embodiment is formed by a wurtzite nitride-based semiconductor whose main surface is the m-plane ((1-100) plane).

Figure 17:
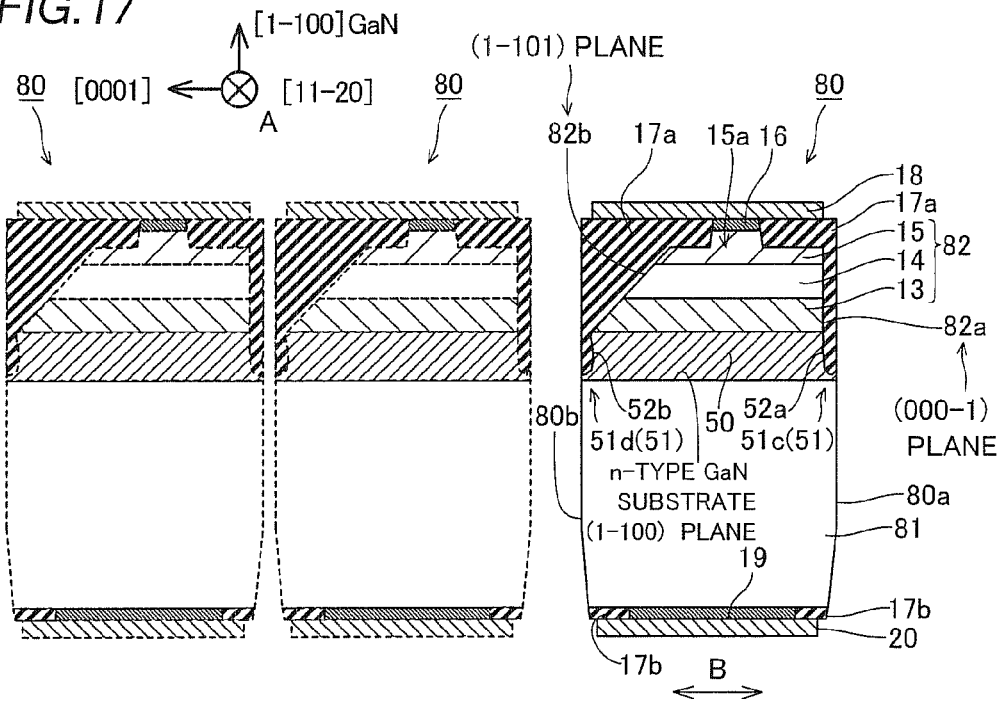
FIG. 17 is a sectional view showing a structure of a nitride-based semiconductor laser device according to a fourth embodiment of the present invention.

In the nitride-based semiconductor laser device 80, the emission layer 82 is formed on the n-type GaN substrate 81 having a thickness of about 100 μm through the underlayer 50 made of $Al_{0.05}Ga_{0.95}N$ having a thickness of about 3 to 4 μm, as shown in FIG. 17. On this underlayer 50, a plurality of groove-shaped cracks 51 are so formed as to extend in a cavity direction (direction perpendicular to the plane of FIG. 17). The light-emitting device layer 82 includes an n-type cladding layer 13, an emission layer 14 and a p-type cladding layer 15 similarly to the aforementioned first embodiment.

According to the fourth embodiment, side surfaces extending in the cavity direction of the nitride-based semiconductor laser device 80 are formed from the n-type cladding layer 13 to the p-type cladding layer 15 by a facet 82a having the (000-1) plane of the light-emitting device layer 82 and a facet 82b having the (1-101) plane formed on a region opposed to the facet 82a. The facets 82a and 82b are examples of the "first side surface" and the "second side surface" in the present invention, respectively.

The facet 82a is so formed as to extend in a direction ([1-100] direction) substantially perpendicular to the main surface of the n-type GaN substrate 81 to take over an inner side surface 52a having the (000-1) plane of the cracks 51 formed on the underlayer 50 in a manufacturing process described later. The facet 82b is formed by an inclined plane starting from an inner side surface 52b of the crack 51 and extends to be inclined at about 62° with respect to the [1-100] direction. Therefore, the facet 82b is inclined at about 118° with respect to the main surface (upper surface) of the light-emitting device layer 82. The inner side surfaces 52a and 52b are examples of the "first side wall" and the "second side wall" in the present invention respectively. The remaining structure of the nitride-based semiconductor laser device 80 according to the fourth embodiment is similar to that of the aforementioned first embodiment.

A manufacturing process for the nitride-based semiconductor laser device 80 according to the fourth embodiment will be now described with reference to FIGS. 17 and 18.

Figure 18:
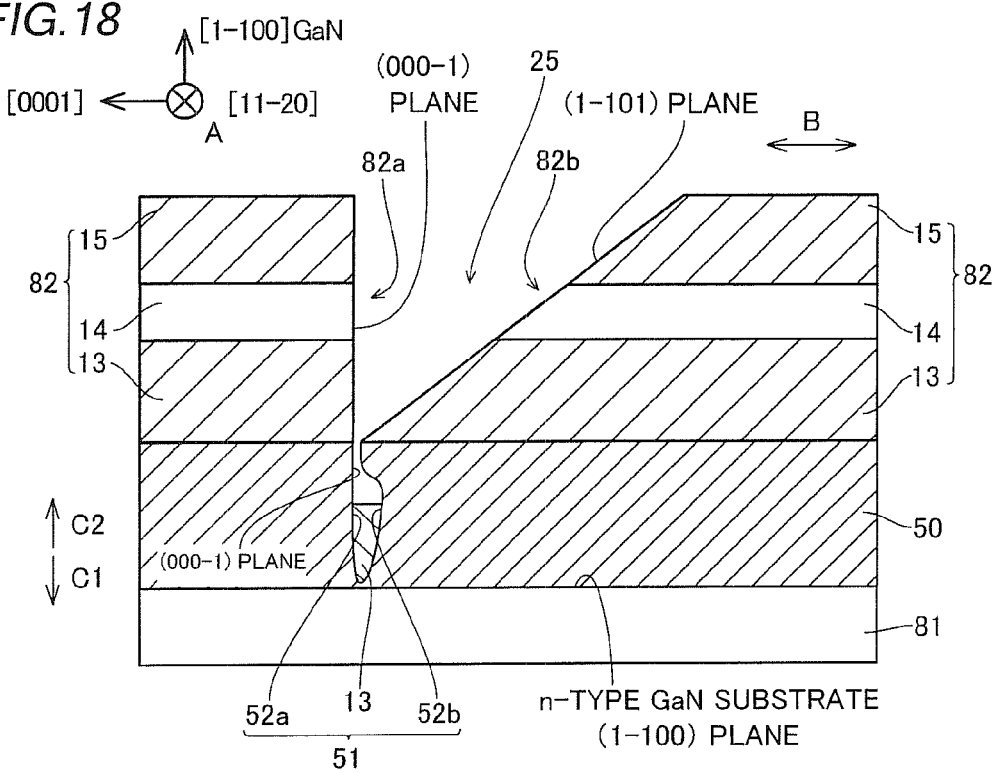
FIG. 18 is a sectional view for illustrating a manufacturing process for the nitride-based semiconductor laser device according to the fourth embodiment of the present invention.

In the manufacturing process according to the fourth embodiment, the underlayer 50 made of $Al_{0.05}Ga_{0.95}N$ having a thickness of about 3 to about 4 μm is grown on the n-type GaN substrate 81 having a thickness of 100 μm, as shown in FIG. 18. At this time, the cracks 51 are formed on the underlayer 50 due to difference of lattice constants of the n-type GaN substrate 81 and the underlayer 50, similarly to the aforementioned second embodiment.

Thereafter, the light-emitting device layer 82 is formed on the underlayer 50 through a manufacturing process similar to that of the aforementioned second embodiment.

At this time, according to the fourth embodiment, the light-emitting device layer 82 is crystal-grown on the inner side surfaces 52a of the cracks 51 extending in the [11-20] direction (direction A) while forming the facets 82a having the (000-1) plane extending in the [1-100] direction (along arrow C2) to take over the (000-1) plane of the cracks 51, as shown in FIG. 18. On a (0001) plane (inner side surfaces 52b) of the cracks 51 opposed to the (000-1) plane of the cracks 51, the light-emitting device layer 82 is crystal-grown while forming the facets (facet 82b) having the (1-101) plane extending in a direction inclined at a prescribed (about 62°) angle with respect to the [1-100] direction (along arrow C2). Thus, the facets 82b are formed so as to form an obtuse angle with respect to the upper surface (main surface) of the light-emitting device layer 82.

Thereafter, the nitride-based semiconductor laser device 80 in a wafer state is cleaved in a bar-shaped and divided through a manufacturing process similar to the aforementioned second embodiment. Thus, individual nitride-based semiconductor laser device 80 separated into chips, shown in FIG. 17, is formed. The wafer is divided in the direction B, whereby the cracks 51 are formed as step portions 52c and 52d (see FIG. 17) which are parts of side end surfaces 80a and 80b of the nitride-based semiconductor laser device 80 in the direction B. The side end surfaces 80a and 80b are examples of the "first side end surface" and the "second side end surface" in the present invention respectively, and the step portions 52c and 52d are examples of the "first step portion" and the "second step portion" in the present invention respectively.

According to the fourth embodiment, as hereinabove described, the light-emitting device layer 82 is formed on the n-type GaN substrate 81 whose main surface are the nonpolar face (m-plane ((1-100) plane)) through the underlayer 50, whereby a piezoelectric field generated on the semiconductor device layer (emission layer 14) or an internal electric field such as intrinsic polarization can be reduced. Thus, heat generated in the light-emitting device layer 82 (emission layer 14) including the vicinity of the cavity facets are further suppressed, and hence the nitride-based semiconductor laser device 80 further improving luminous efficiency can be formed.

According to the fourth embodiment, the inner side surfaces 52a of the cracks 51 are formed by the (000-1) plane, whereby the (000-1) plane of the light-emitting device layer 82 is formed to take over the inner side surfaces 52a of the cracks 51 having the (000-1) plane when forming the light-emitting device layer 82 having the facets 82a having the (000-1) plane on the main surface of the n-type GaN substrate 81, and hence the facets 82a having the (000-1) plane can be easily formed on the n-type GaN substrate 81 through the underlayer 50.

According to the fourth embodiment, the facets 82b are formed so as to form the obtuse angle with respect to the main surface (upper surface) of the light-emitting device layer 82, whereby the regions where the facets 82a and 82b are opposed to each other (upper regions of the cracks 51 of the underlayer 50 (recess portions 25 in FIG. 18)) are formed to expand from the n-type GaN substrate 81 toward the upper surface of the light-emitting device layer 82. Thus, the facets 82a and 82b can be inhibited from coming close to each other, and hence the nitride-based semiconductor laser device 80 can be easily divided on portions, where insulating films 17a are formed, between the facets 82a and 82b, when separating the nitride-based semiconductor laser device 80 into chips. The effects of the fourth embodiment are similar to those of the aforementioned second embodiment.

EXAMPLE

Figure 19:
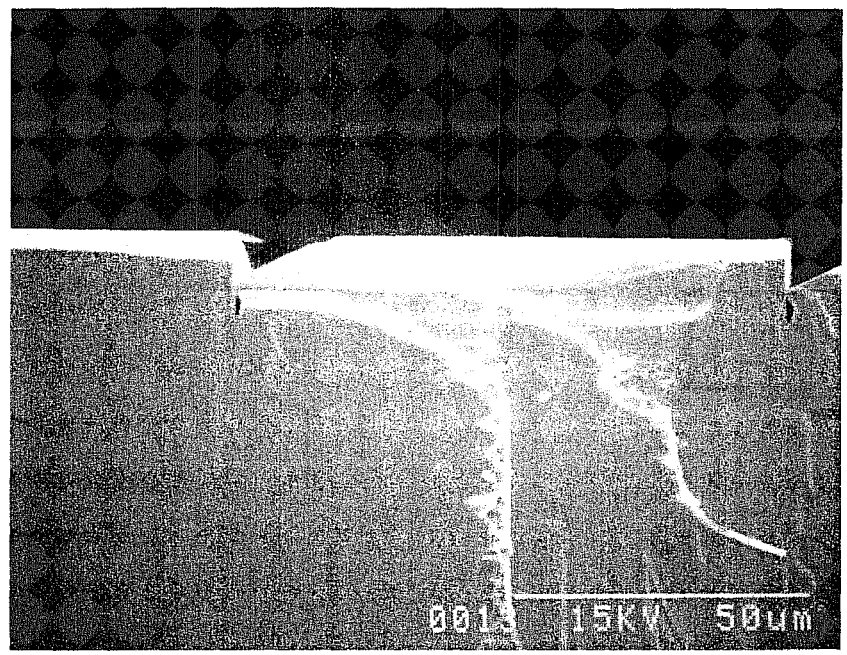
FIGS. 19 and 20 are SEM photographs of a cross section of a state of crystal growth of a nitride-based semiconductor layer on an n-type GaN substrate in the manufacturing process of the fourth embodiment of the present invention, observed by employing a scanning electron microscope (SEM)
Figure 20:
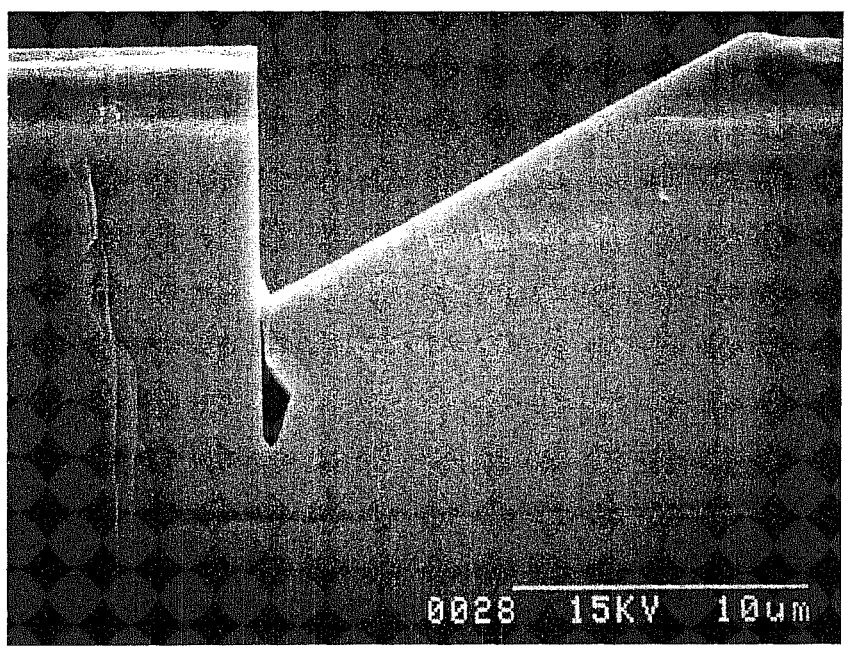

An experiment conducted for confirming the effects of the aforementioned fourth embodiment will be described with reference to FIGS. 18 to 20.

In this confirmatory experiment, an underlayer made of AlGaN having a thickness of 3 to 4 μm was formed on an n-type GaN substrate whose main surface is an m-plane ((1-100) plane) by MOCVD through a manufacturing process similar to the manufacturing process of the aforementioned fourth embodiment. At this time, cracks as shown in FIGS. 19 and 20 were formed on the underlayer due to difference between lattice constants of the n-type GaN substrate and the underlayer. At this time, it has been confirmed that the cracks formed a (000-1) plane extending in a direction perpendicular to the main surface of the n-type GaN substrate, as shown in FIG. 20. Further, it has been confirmed that the cracks were formed in a striped manner along a [11-20] direction (direction A) orthogonal to a [0001] direction (direction B) of the n-type GaN substrate, as shown in FIG. 18.

A semiconductor layer of GaN was epitaxially grown on the underlayer by MOCVD. Consequently, it has been confirmed that the semiconductor layer was crystal-grown on inner side surfaces having the (000-1) plane of the cracks in a [1-100] (direction C2) direction while forming the (000-1) plane of GaN extending in a vertical direction so as to take over this plane orientation, as shown in FIG. 20. As shown in FIG. 20, it has been confirmed that inclined planes (facets) having the (1-101) plane of GaN were formed on inner side surfaces of the cracks opposite to the (000-1) plane of the cracks. It has been confirmed that these inclined planes were formed so as to form an obtuse angle with respect to the upper surface (main surface) of the semiconductor layer. Thus, it has been confirmed that the semiconductor layer can be formed on the underlayer starting from the crystal growth of the two inner side surfaces of the cracks provided on the underlayer. It has been confirmed that voids of the cracks reaching the n-type GaN substrate in forming the underlayer were partially filled up following lamination of the semiconductor layer.

Fifth Embodiment

Figure 21:
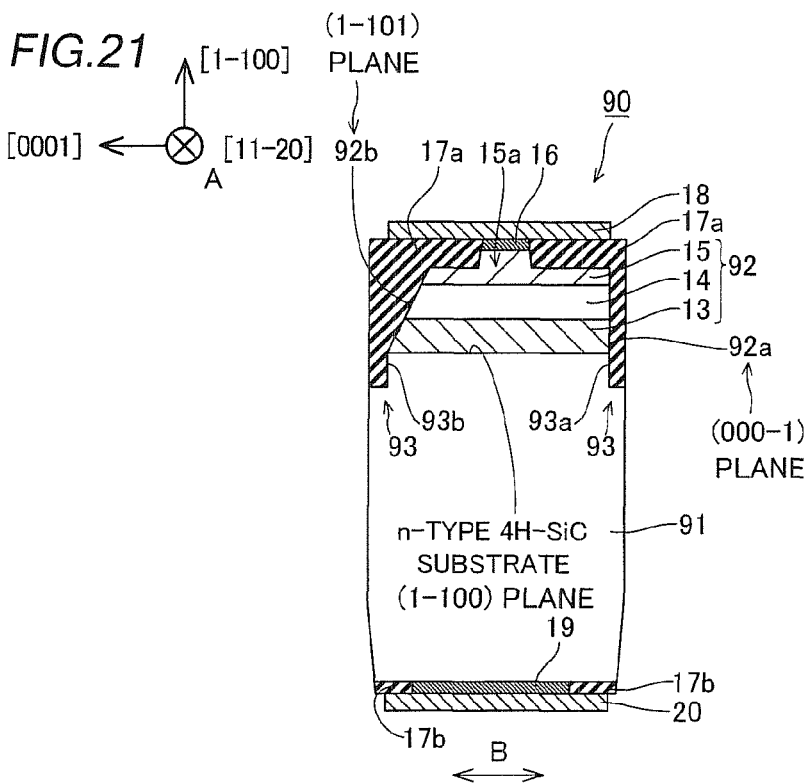
FIG. 21 is a sectional view showing a structure of a nitride-based semiconductor laser device according to a fifth embodiment of the present invention.

Referring to FIG. 21, in a nitride-based semiconductor laser device 90 according to a fifth embodiment, a light-emitting device layer 92 is formed on an n-type 4H—SiC substrate 91 whose main surface is an m-plane ((1-100) plane) dissimilarly to the aforementioned first embodiment. The n-type 4H—SiC substrate 91 and the light-emitting device layer 92 are examples of the "substrate" and the "nitride-based semiconductor layer" in the present invention respectively.

This nitride-based semiconductor laser device 90 according to the fifth embodiment is formed by a wurtzite nitride-based semiconductor whose main surface is an m-plane ((1-100) plane). The nitride-based semiconductor laser device 90 is an example of the "semiconductor device" or the "semiconductor laser device" in the present invention.

In the nitride-based semiconductor laser device 90, the light-emitting device layer 92 is formed on the n-type 4H—SiC substrate 91 having a thickness of about 100 μm, as shown in FIG. 21. The light-emitting device layer 92 includes an n-type cladding layer 13, an emission layer 14 and a p-type cladding layer 15 similarly to the aforementioned first embodiment.

According to the fifth embodiment, side surfaces extending in a cavity direction (direction A) of the nitride-based semiconductor laser device 90 are formed from the n-type cladding layer 13 to the p-type cladding layer 15 by a facet 92a having the (000-1) plane of the light-emitting device layer 92 and a facet 92b having the (1-101) plane formed on a region opposed to the facet 92a. The facets 92a and 92b are examples of the "first side surface" and the "second side surface" in the present invention, respectively.

The facet 92a is so formed as to extend in a direction ([1-100] direction) substantially perpendicular to the main surface of the n-type 4H—SiC substrate 91 to take over an inner side surface 93a of a groove portion 93 formed on the main surface of the n-type 4H—SiC substrate 91. The facet 92b is formed by an inclined plane starting from an inner side surface 93b of the groove portion 93 and extends to be inclined at about 62° with respect to the [1-100] direction. The groove portion 93 and the inner side surfaces 93a and 93b are examples of the "recess portion", the "first side wall" and the "second side wall" in the present invention respectively.

The remaining structure and manufacturing process for the nitride-based semiconductor laser device 90 according to the fifth embodiment is similar to those of the aforementioned first embodiment. The effects of the fifth embodiment are similar to those of the aforementioned first and fourth embodiments.

Sixth Embodiment

A structure of a LED chip 100 according to a sixth embodiment will be described with reference to FIG. 22. The LED chip 100 is an example of the "semiconductor device" or the "light-emitting device" in the present invention.

This LED chip 100 according to the sixth embodiment is formed by a wurtzite nitride-based semiconductor whose main surface is a (11-2-2) plane. The LED chip 100 has a planar shape such as a square, a rectangle, a rhombus or a parallelogram as viewed from a side of an upper surface of the LED chip 100.

Figure 22:
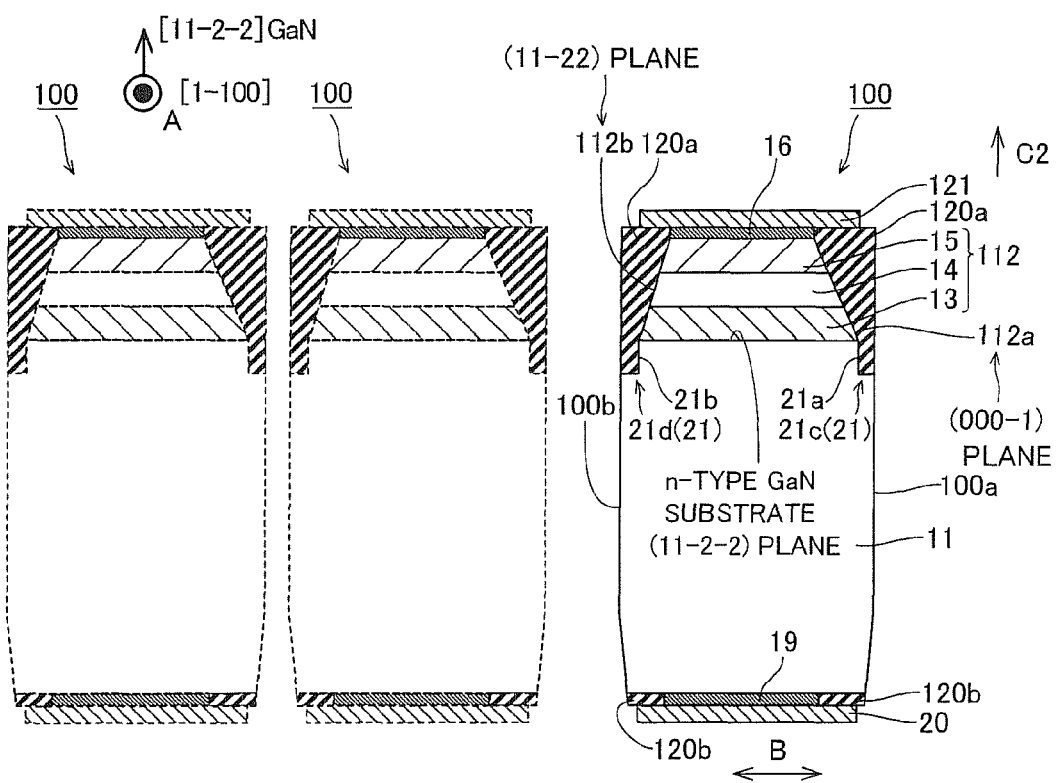
FIG. 22 is a sectional view showing a structure of a light emitting diode chip (LED chip) according to a sixth embodiment of the present invention.

In the LED chip 100, a light-emitting device layer 112 is formed on an n-type GaN substrate 11 having a thickness of about 100 μm, as shown in FIG. 22. The light-emitting device layer 112 includes an n-type cladding layer 13, an emission layer 14 and a p-type cladding layer 15 similarly to the aforementioned first embodiment. The light-emitting device layer 112 is an example of the "nitride-based semiconductor layer" in the present invention.

According to the sixth embodiment, side surfaces extending in a first direction (direction perpendicular to the plane of FIG. 22) of the LED chip 100 are formed from the n-type cladding layer 13 to the p-type cladding layer 15 by a facet 112a having a (000-1) plane of the light-emitting device layer 112 and a facet 112b having a (11-22) plane. The facets 112a and 112b are examples of the "first side surface" and the "second side surface" in the present invention respectively.

The facets 112a and 112b are formed starting from inner side surfaces 21a and 21b of a groove portion 21 previously formed on the main surface of the n-type GaN substrate 11 in a manufacturing process and extend while inclining at a prescribed angle with respect to the main surface of the n-type GaN substrate 11. More specifically, the facet 112a extends while inclining at about 32° with respect to a [11-2-2] direction in which the upper surface (main surface) of the light-emitting device layer 112 is grown. The facet 112b extends while inclining at about 26° with respect to the [11-2-2] direction. Thus, the LED chip 100 has a shape in which a sectional view in the first direction (direction perpendicular to the plane of FIG. 22) is tapered along a direction (along arrow C2) away from the main surface of the n-type GaN substrate 11 at a portion of the light-emitting device layer 112, as shown in FIG. 22. The facets 112a and 112b are formed to form obtuse angles with respect to the upper surface (main surface) of the light-emitting device layer 112. More specifically, the facet 112a is inclined at about 122° with respect to the upper surface of the light-emitting device layer 112 and the facet 112b is inclined at about 116° with respect to the upper surface of the light-emitting device layer 112. For simplified illustration purposes, although the components of one LED chip 100 are denoted by reference numerals in FIG. 22, other LED chips 100 (outer shape is shown by broken lines) on the left of the one LED chip 100 also have the same structure.

As shown in FIG. 22, the p-side ohmic electrode 16 is formed on the p-type cladding layer 15. Insulating films 120a made of $SiO_2$ which is transparent with respect to an emission wavelength are formed to have prescribed shapes and to cover the both side surfaces of the p-side ohmic electrode 16, the facets 112a and 112b, and the inner side surfaces 21a and 21b of the groove portion 21. A p-side pad electrode 121 made of ITO having translucence is formed to cover the upper surfaces of the p-side ohmic electrode 16 and the insulating films 120. An n-side ohmic electrode 19 and an n-side electrode 20 are formed on a lower surface of the n-type GaN substrate 11 successively from the n-type GaN substrate 11. Insulating films 120b made of SiO$_2$ are formed on both sides (in the direction B) of the n-side ohmic electrode 19, respectively.

Figure 23:
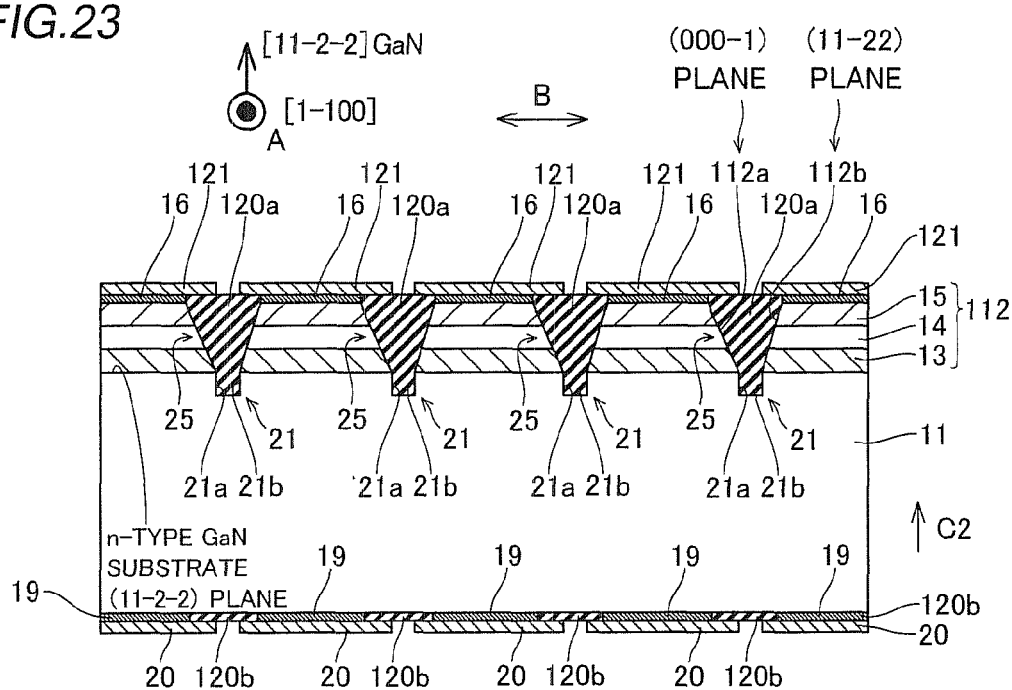
FIG. 23 is a sectional view for illustrating a manufacturing process for the LED chip according to the sixth embodiment of the present invention.

A manufacturing process for the LED chip 100 according to the sixth embodiment will be now described with reference to FIGS. 22 and 23.

In the manufacturing process for the LED chip 100 according to the sixth embodiment, the light-emitting device layer 112 is formed on the n-type GaN substrate 11 through a manufacturing process similar to the manufacturing process for the nitride-based semiconductor laser device 30 according to the aforementioned first embodiment. Thus, the facets 112a having the (000-1) plane extending in the direction inclined at the prescribed angle (about 32°) with respect to the [11-2-2] direction (along arrow C2) of the n-type GaN substrate 11 and the facets 112b having the (11-22) plane extending in the direction inclined at prescribed angle (about 26°) with respect to the [11-2-2] direction (along arrow C2) of the n-type GaN substrate 11 are formed.

Thereafter, the p-side ohmic electrode 16, the insulating films 120a and 120b, the p-side pad electrode 121, the n-side ohmic electrode 19 and the n-side electrode 20 are successively formed through a manufacturing process similar to that of the aforementioned first embodiment.

Finally, the LED chip 100 in a wafer state is divided, thereby forming the individual LED chip 100 separated into chips shown in FIG. 22. The device division of the wafer is performed in the direction B, whereby the groove portions 21 are formed as step portions 21c and 21d (see FIG. 22) which are parts of side end surfaces 100a and 100b of the LED chip 100 in the direction B. The side end surfaces 100a and 100b are examples of the "first side end surface" and the "second side end surface" in the present invention respectively.

According to the sixth embodiment, as hereinabove described, the LED chip 100 comprises the light-emitting device layer 112 including the facets 112a and 112b starting from the inner side surfaces 21a and 21b of the groove portion 21 respectively formed on the main surface of the n-type GaN substrate 11. Thus, dissimilarly to a LED chip separated by forming dividing grooves on the semiconductor layer 112 by etching, mechanical scribing or laser scribing, the facets 112a and 112b are not side surfaces formed by the dividing grooves which are formed through the aforementioned method. Therefore, no defect caused on the emission layer 14 in forming the dividing grooves through the aforementioned method exists on the facets 112a and 112b, and hence reduction in luminous efficiency of the LED chip 100 can be suppressed. Thus, heat is unlikely to be abnormally generated in the LED chip 100, and hence reduction in the life of the LED chip 100 can be suppressed.

According to the sixth embodiment, the facets 112a and 112b are formed to form obtuse angles with respect to the main surface (upper surface) of the light-emitting device layer 112, whereby the regions where the facets 112a and 112b are opposed to each other (upper regions of the groove portion 21 of the n-type GaN substrate 11 (recess portions 25 in FIG. 23)) are formed to expand from the n-type GaN substrate 11 toward the upper surface of the light-emitting device layer 112. Thus, the facets 112a and 112b can be inhibited from coming close to each other, and hence the LED chip 100 can be divided on portions, where the insulating films 120a are formed, between the facets 112a and 112b, when separating the LED chip 100 into chips.

According to the sixth embodiment, the facets 112a and 112b are formed to form obtuse angles with respect to the main surface of the light-emitting device layer 112, whereby LED light from the emission layer 14 can be easily extracted not only through the upper surface of the light-emitting device layer 112 but also through the facets 112a and 112b inclined with respect to the main surface of the n-type GaN substrate 11. Thus, luminous efficiency of the LED chip 100 can be further improved.

As hereinabove described, the facets 112a and 112b are inclined at angles of about 112° and 116° with respect to the main surface (upper surface) of the light-emitting device layer 112 respectively, whereby the facets 112a and 112b have substantially the same inclined angle with respect to the upper surface of the light-emitting device layer 112. Thus, LED light from the emission layer 14 transmits through the facets 112a and 112b equally. Consequently, irregular emission of the LED chip 100 can be suppressed. The remaining effects of the sixth embodiment are similar to those of the aforementioned first embodiment.

Seventh Embodiment

A structure of a field-effect transistor (FET) 200 according to a seventh embodiment which is an exemplary electronic device will be described with reference to FIG. 24.

The FET 200 is a so-called high-electron-mobility transistor (HEMT) having a recess structure. In this FET 200, a semiconductor layer 202 is formed on an m-plane ((1-100) plane) of a vanadium doped high-resistance 4H—SiC substrate 201, as shown in FIG. 24. The FET 200 includes the semiconductor layer 202, a source electrode 203 formed on a main surface of the semiconductor layer 202, a drain electrode 204 and a gate electrode 205. The FET 200 is an example of the "electronic device" in the present invention.

The semiconductor layer 202 is formed with a first nitride semiconductor layer 211 made of undoped GaN having a thickness of about 3 μm, a second nitride semiconductor layer 212 made of AlGaN having a thickness of about 25 nm and a cap layer 213 made of Si-doped n-type GaN having a thickness of about 25 nm. The cap layer 213 is formed on regions of the second nitride semiconductor layer 212 except the vicinity of the gate electrode 205, and a region, where the gate electrode 205 is formed, of the second nitride semiconductor layer 212 is exposed on the surface. The semiconductor layer 202, the first nitride semiconductor layer 211, the second nitride semiconductor layer 212 and the cap layer 213 are examples of the "nitride-based semiconductor layer" in the present invention.

An n-type impurity such as Si is doped on an interface side of the first nitride semiconductor layer 211 with a part of the second nitride semiconductor layer 212. Thus, a drain current can be increased, and performance of the FET 200 can be further improved.

The gate electrode 205 is so formed that a longitudinal direction perpendicular to an arrangement direction of the source electrode 203 and the drain electrode 204 is parallel to a [11-20] direction (direction B in FIG. 24) of the semiconductor layer 202.

The second nitride semiconductor layer 212 has a band gap larger than a band gap of the first nitride semiconductor layer 211, and heterojunction is formed between the second nitride semiconductor layer 212 and the first nitride semiconductor layer 211. At this time, a part of the second nitride semiconductor layer 212 is doped with the n-type impurity such as Si, and the impurity with a dose of at least $1\times10^{13}$ cm$^{-2}$ is doped so that the product of a concentration of the n-type impurity and a thickness of the doping layer is at least $1 \times 10^{13}$ cm$^{-2}$.

The gate electrode 205, formed by a Pd layer and an Au layer, for example, is formed on the second nitride semiconductor layer 212. The source electrode 203 and the drain electrode 204, each of which is formed by a Ti layer and an Al layer, for example, are formed on the cap layer 213.

Further, heterojunction of the (1-100) plane is formed on the semiconductor layer 202, so that carriers generated by polarization are reduced in heterojunction, and hence sheet carrier concentration of heterojunction can be reduced. In other words, a nitride-based material originally has large intrinsic polarization in a [0001] direction, and large polarization by a piezoelectric effect occurs when strain in the [0001] direction exists, and hence a large number of carriers are stored in heterojunction of a c-plane ((0001) plane). According to the seventh embodiment, occurrence of the aforementioned phenomenon is avoided by forming the heterojunction of the (1-100) plane of the semiconductor layer 202.

A manufacturing process for the FET 200 according to the seventh embodiment will be now described with reference to FIGS. 24 to 27.

Figure 25:
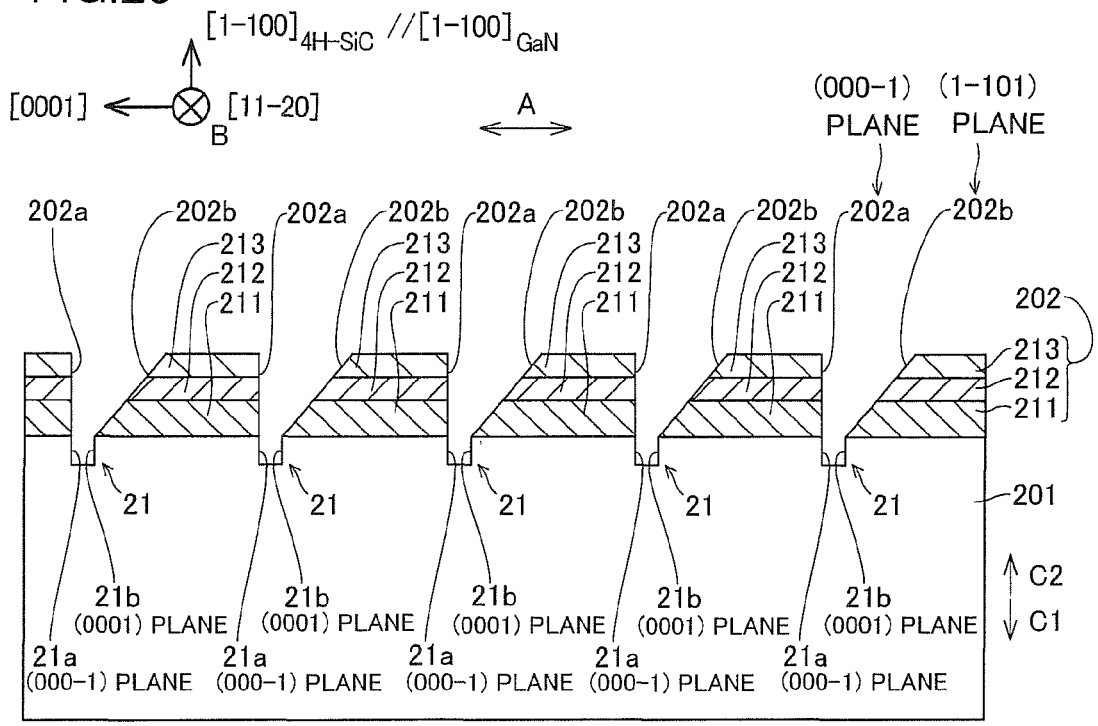
FIGS. 25 to 27 are sectional views for illustrating a manufacturing process for the FET according to the seventh embodiment of the present invention.

As shown in FIG. 25, groove portions 21 having shapes similar to the aforementioned first embodiment is formed on the main surface of the 4H—SiC substrate 201 by etching.

The first nitride semiconductor layer 211, the second nitride semiconductor layer 212 and the cap layer 213 are successively stacked on the 4H—SiC substrate 201 having the groove portion 21 by MOCVD, thereby forming the semiconductor layer 202.

At this time, according to the seventh embodiment, the semiconductor layer 202 is crystal-grown on inner side surfaces 21a having the (000-1) plane of the groove portion 21 while forming the (000-1) plane extending the [1-100] direction (along arrow C2) while taking over the (000-1) plane of the groove portion 21, as shown in FIG. 25. Thus, the (000-1) plane of the semiconductor layer 202 is formed as facets 202a. On the (0001) plane (inner side surfaces 21b) of the groove portions 21 opposed to the (000-1) plane of the groove portions 21, the semiconductor layer 202 is crystal-grown starting from the inner side surfaces 21b, while forming facets 202b having a (1-101) plane extending in a direction inclined by a prescribed angle (about 62°) with respect to the facets 202a. The facets 202a and 202b are examples of the "first side surface" and the "second side surface" in the present invention, respectively.

Figure 26:
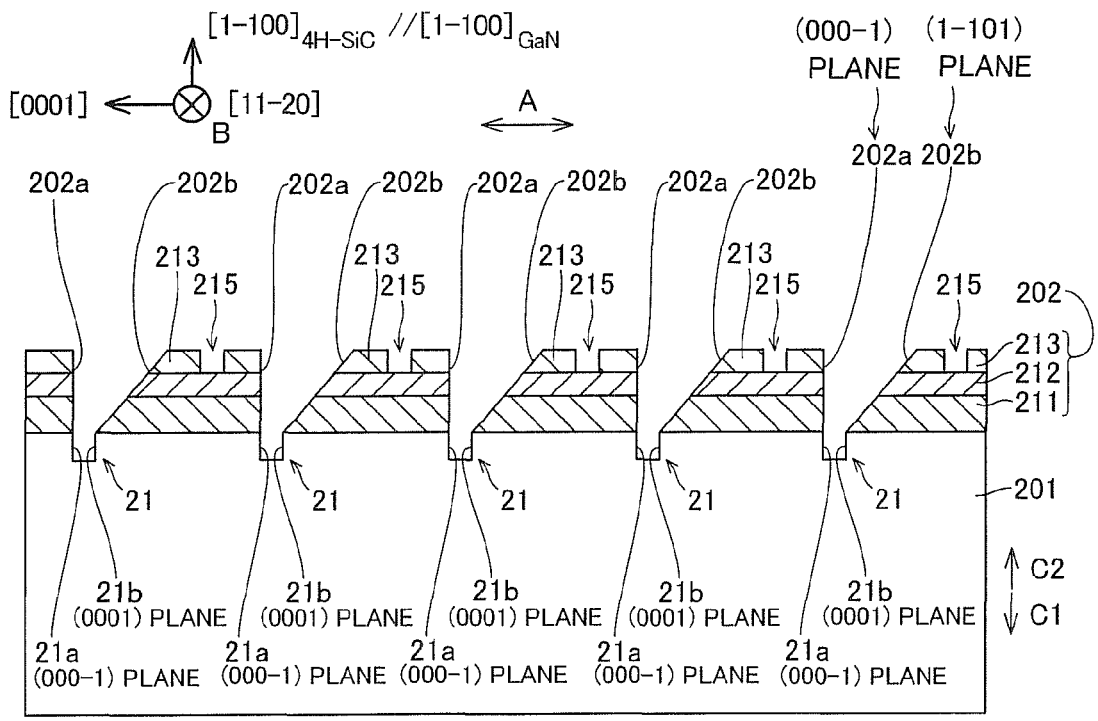
Figure 27:
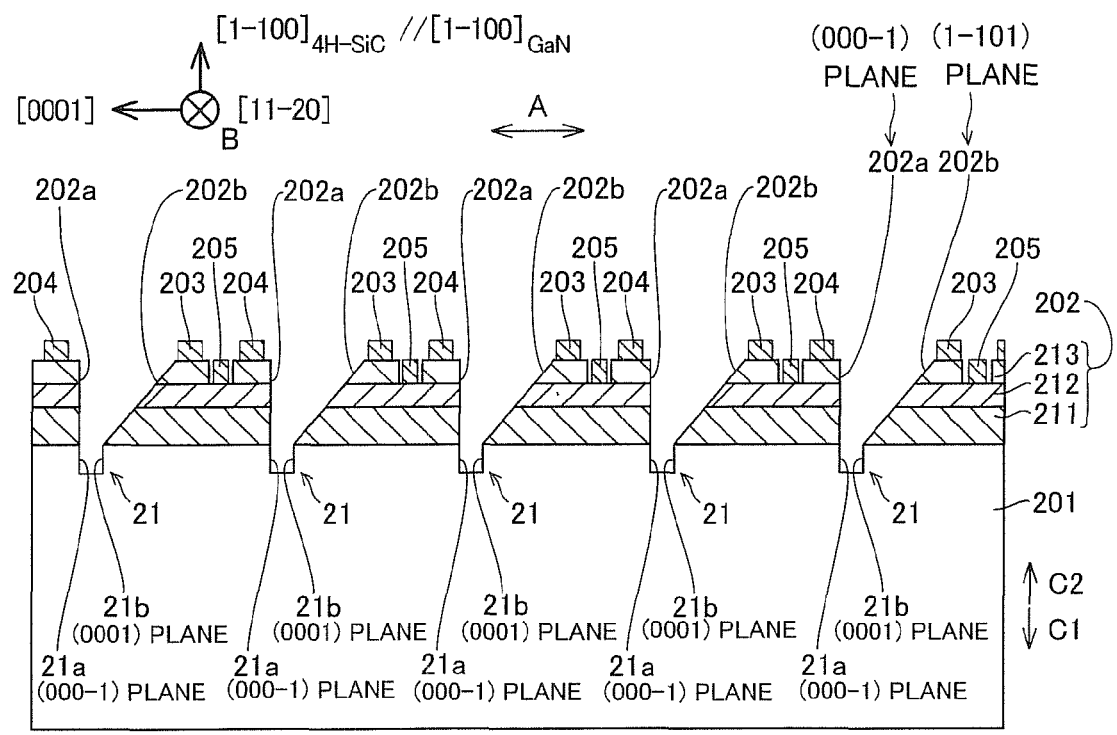

Thereafter, groove portions 215 extending in the [11-20] direction (direction B) are formed on the cap layer 213 of the semiconductor layer 202 by etching, as shown in FIG. 26. Thereafter, the source electrode 203 and the drain electrode 204 are formed by evaporating the Ti layer and the Al layer on the surface of the cap layer 213 successively from the cap layer 213 and employing a lift-off method, as shown in FIG. 27. Further, the gate electrode 205 is formed on a prescribed position of the groove portions 215 held between the cap layers 213 by evaporating the Pd layer and the Au layer on successively from the cap layer 213 and employing a lift-off method.

Figure 24:
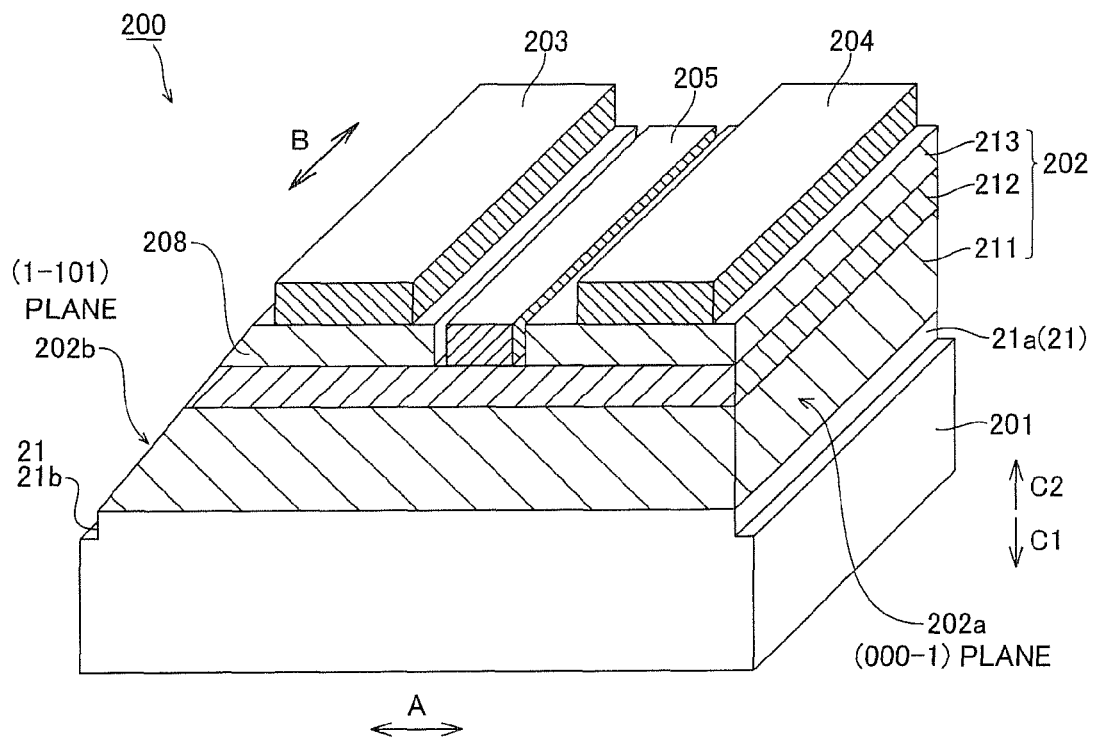
FIG. 24 is a perspective view showing a structure of a field-effect transistor (FET) according to a seventh embodiment of the present invention.

Finally, the device (wafer) is divided into chips, thereby forming the FETs 200 according to the seventh embodiment shown in FIG. 24.

The FET 200 is formed through the manufacturing process of the seventh embodiment, whereby high concentration sheet carriers are not stored in a heterointerface unlikely to a conventional FET employing heterojunction of a (0001) plane, and hence a two-dimensional electron gas concentration of the heterointerface can be reduced. In other words, a pinch-off voltage can be precisely controlled, whereby a normally-off FET which is different from the conventional FET employing heterojunction of the (0001) plane can be formed.

According to the seventh embodiment, the FET 200 are formed by the semiconductor layer 202 formed with the facets 202a and 202b, whereby no defect exists on the semiconductor layer 202 and heat abnormally generated from the semiconductor device can be suppressed, and hence reduction in the life of the FET 200 can be suppressed. The remaining effects of the seventh embodiment are similar to the effects in the aforementioned schematic structure.

Although the present invention has been described and illustrated in detail, it is clearly understood that the same is by way of illustration and example only and is not to be taken by way of limitation, the spirit and scope of the present invention being limited only by the terms of the appended claims.

For example, while the cracks 51 are voluntarily caused on the underlayer by utilizing the difference in the lattice constants of the n-type GaN substrate 11 and the underlayer 50 in the aforementioned second embodiment, the present invention is not restricted to this but positions of forming the cracks may be controlled by forming scribed grooves of dashed line shapes on the underlayer similarly to the aforementioned third embodiment.

While the n-type GaN substrate is employed as the base substrate and the underlayer of AlGaN is formed on the n-type GaN substrate in each of the aforementioned second to fourth embodiments, the present invention is not restricted to this but an InGaN substrate may be employed as the base substrate and an underlayer made of GaN or AlGaN may be formed on the InGaN substrate.

While the cracks 51 are voluntarily formed on the underlayer 50 by utilizing the difference in the lattice constants of the n-type GaN substrate 11 and the underlayer 50 in the aforementioned second embodiment, the present invention is not restricted to this but scribed grooves may be formed only on both ends of the underlayer 50 (see FIG. 12) in the direction A ([1-100] direction) (regions corresponding to ends of the n-type GaN substrate 11 in the direction A). Cracks extending in the direction A starting from the scribed grooves on the both ends can be introduced also by this structure.

While the scribed grooves 70 of dashed line shapes for crack introduction are formed on the underlayer 50 in the aforementioned third embodiment, the present invention is not restricted to this but scribed grooves on both ends of the underlayer 50 in the direction A (see FIG. 15) (regions corresponding to the ends of the n-type GaN substrate 11) may be formed. Cracks extending in the direction A starting from the scribed grooves on the both ends can be introduced also by this structure.

While the nitride-based semiconductor laser device having a refractive-index-guided ridge waveguide structure in which the ridge portions are buried by the SiO$_2$ current blocking layer in each of the aforementioned first to fifth embodiments, the present invention is not restricted to this but a nitride-based semiconductor laser device in which the ridge portions are buried by a semiconductor current blocking layer made of AlGaN may be formed. Alternatively, a lower cladding layer, an emission layer (active layer) and an upper cladding layer are successively formed on a flat substrate so that the nitride-based semiconductor laser device having a gain guiding oxide stripe structure further restricting a current path thereon by a current blocking layer may be formed.

What is claimed is:

1. A nitride-based semiconductor device comprising:
   a substrate;
   a first step portion formed on a main surface side of a first side end surface of said substrate;
   a second step portion formed on said main surface side of a second side end surface substantially parallel to said first side end surface on an opposite side of said first side end surface; and
   a nitride-based semiconductor layer whose first side surface is a (000-1) plane starting from a first side wall of said first step portion and a second side surface starting from a second side wall of said second step portion on said main surface;
   wherein,
   said substrate includes a base substrate and an underlayer formed on said base substrate,
   said underlayer has a first crack and a second crack,
   a first inner side surface of said first crack is said first side wall and a second inner side surface of said second crack is said second side wall,
   said first side surface is formed starting from said first inner side surface and said second side surface is formed starting from said second inner side surface,
   said first crack and said second crack extend to the direction parallel to a (0001) plane of said underlayer and said main surface.

2. The nitride-based semiconductor device according to claim 1, wherein
   said nitride-based semiconductor layer has an emission layer, and
   said nitride-based semiconductor device is a light-emitting device.

3. The nitride-based semiconductor device according to claim 1, wherein
   said first side wall is formed by a (000-1) plane.

4. The nitride-based semiconductor device according to claim 1, wherein
   said second side surface is formed by a {A+B, A, −2A−B, 2A+B} plane (A and B satisfy A≧0 and B≧0, and at least either one of A and B is a nonzero integer).

5. The nitride-based semiconductor device according to claim 4, wherein
   said second side surface is formed by a (1-101) plane or a (11-22) plane.

6. The nitride-based semiconductor device according to claim 1, wherein
   said nitride-based semiconductor layer is so formed that a plane area of said nitride-based semiconductor layer is reduced in a direction away from said substrate along a direction of stacking of said nitride-based semiconductor layer by said first side surface and said second side surface.

7. The nitride-based semiconductor device according to claim 1, wherein
   at least either said first side surface or said second side surface is formed at slant so as to form an obtuse angle with respect to said main surface.

8. The nitride-based semiconductor device according to claim 1, wherein
   said first side surface and said second side surface are formed by crystal growth facets of said nitride-based semiconductor layer.

9. The nitride-based semiconductor device according to claim 1, wherein said underlayer is made of AlGaN.

10. The nitride-based semiconductor device according to claim 1, wherein
    when lattice constants of said base substrate and said underlayer are c1 and c2 respectively, c1 and c2 satisfy the relation of c1>c2.

11. A nitride-based semiconductor device comprising:
    a substrate;
    a first step portion formed on a main surface side of a first side end surface of said substrate;
    a second step portion formed on said main surface side of a second side end surface substantially parallel to said first side end surface on an opposite side of said first side end surface; and
    a nitride-based semiconductor layer whose first side surface is a (000-1) plane starting from a first side wall of said first step portion and a second side surface starting from a second side wall of said second step portion on said main surface, wherein
    said substrate includes a base substrate and an underlayer made of AlGaN formed on said base substrate,
    when lattice constants of said base substrate and said underlayer are $c_1$ and $c_2$ respectively, $c_1$ and $c_2$ satisfy the relation of c1>c2, and
    said underlayer has a first crack and a second crack,
    a first inner side surface of said first crack is said first side wall and a second inner side surface of said second crack is said second side wall,
    said first side surface is formed starting from said first inner side surface and said second side surface is formed starting from said second inner side surface,
    said first crack and said second crack extend to the direction parallel to a (0001) plane of said underlayer and said main surface.

12. The nitride-based semiconductor device according to claim 1, wherein
    said first side surface and said second side surface extend along a first direction, and said nitride-based semiconductor device has an optical waveguide extending along said first direction.

13. The nitride-based semiconductor device according to claim 11, wherein
    said nitride-based semiconductor layer has an emission layer, and
    said nitride-based semiconductor device is a light-emitting device.

14. The nitride-based semiconductor device according to claim 11, wherein
    said first side wall is formed by a (000-1) plane.

15. The nitride-based semiconductor device according to claim 11, wherein
    said second side surface is formed by a {A+B, A, −2A−B, 2A+B} plane (A and B satisfy A≧0 and B≧0, and at least either one of A and B is a nonzero integer).

16. The nitride-based semiconductor device according to claim 11, wherein
    said second side surface is formed by a (1-101) plane or a (11-22) plane.

17. The nitride-based semiconductor device according to claim 11, wherein
    said nitride-based semiconductor layer is so formed that a plane area of said nitride-based semiconductor layer is reduced in a direction away from said substrate along a direction of stacking of said nitride-based semiconductor layer by said first side surface and said second side surface.

18. The nitride-based semiconductor device according to claim 11, wherein at least either said first side surface or said second side surface is formed at slant so as to form an obtuse angle with respect to said main surface.

19. The nitride-based semiconductor device according to claim 11, wherein said first side surface and said second side surface are formed by crystal growth facets of said nitride-based semiconductor layer.

20. The nitride-based semiconductor device according to claim 11, wherein said first side surface and said second side surface extend along a first direction, and said nitride-based semiconductor device has an optical waveguide extending along said first direction.

* * * * *